(12) United States Patent
Oxman et al.

(10) Patent No.: US 6,692,611 B2
(45) Date of Patent: Feb. 17, 2004

(54) METHOD OF PRODUCING A LAMINATED STRUCTURE

(75) Inventors: Joel D. Oxman, Minneapolis, MN (US); Michael A. Kropp, Cottage Grove, MN (US); Peter B. Hogerton, White Bear Lake, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/995,038

(22) Filed: Nov. 26, 2001

(65) Prior Publication Data

US 2002/0066528 A1 Jun. 6, 2002

Related U.S. Application Data

(62) Division of application No. 09/365,289, filed on Jul. 30, 1999, now Pat. No. 6,395,124.

(51) Int. Cl.$^7$ .............................................. B32B 31/28
(52) U.S. Cl. ............................. 156/275.5; 156/275.7; 257/778; 257/783
(58) Field of Search ..................... 156/275.1, 275.3, 156/275.5, 275.7; 257/778, 783; 79/832

(56) References Cited

U.S. PATENT DOCUMENTS

| | | | |
|---|---|---|---|
| 4,656,314 A | 4/1987 | Durand | 174/68.5 |
| 4,735,632 A | 4/1988 | Oxman et al. | |
| 5,065,505 A | 11/1991 | Matsubara et al. | 29/830 |
| 5,296,063 A | 3/1994 | Yamamura et al. | 156/64 |
| 5,356,947 A | 10/1994 | Ali et al. | 522/57 |
| 5,360,652 A | 11/1994 | Kobayashi et al. | 428/64 |
| 5,607,985 A | 3/1997 | Masuhara et al. | 522/28 |
| 5,663,593 A | 9/1997 | Mostafazadeh et al. | 257/778 |
| 5,682,066 A | * 10/1997 | Gamota et al. | 257/783 |
| 5,785,793 A | 7/1998 | Arai et al. | 156/272.2 |
| 5,796,050 A | 8/1998 | Campbell | 156/275.3 |
| 5,798,015 A | 8/1998 | Nohr et al. | 156/275.5 |
| 5,829,125 A | 11/1998 | Fujimoto et al. | 29/840 |
| 5,856,373 A | 1/1999 | Kaisaki et al. | 522/25 |

FOREIGN PATENT DOCUMENTS

| | | |
|---|---|---|
| DE | 3 939 628 | 11/1911 |
| EP | 0 449 619 A2 | 10/1991 |
| JP | 7-106723 | 4/1995 |
| JP | 7-81114 | 8/1995 |
| JP | 9-115986 | 5/1997 |

OTHER PUBLICATIONS

Skinner, D., "*UV Curing Through Semi–transparent Materials —The challenge of the DVD Bonding Process*," Rad–Cure Letter, Apr. 1998, p. 53–56.

Modern Plastics Encyclopedia, McGraw–Hill, Inc., vol. 51, No.10A, 1974–1975, p. 559.

Excerpt of Conference Proceedings: Saller, "Photoinitiated Adhesives –Innovations in Smart Card Production," DELO Industrieklebstoffe GmbH & Co. KG, Feb. 21–25, 1999, 13 pages.

* cited by examiner

*Primary Examiner*—Jeff H. Aftergut
*Assistant Examiner*—Todd J. Kilkenny
(74) *Attorney, Agent, or Firm*—Melanie G. Gover; Lorraine R. Sherman; Jean A. Lown

(57) ABSTRACT

A method of laminating a structure comprises at least two layers and a photopolymerizable adhesive composition between the layers, at least one of the layers being opaque, colored, or reflective. One or both of the layers is transmissive to actinic radiation in wavelengths in the range of greater than 400 nm and up to 1200 nm. The photopolymerizable adhesive composition absorbs radiation in the identified spectral region of the radiation transmissive layer. Curing is effected by directing radiation in the identified spectral region through the radiation transmissive layer and produces a laminated structure.

An underfilled flip chip assembly on an integrated circuit board substrate can be prepared by the method described above. The photopolymerizable adhesive composition can be applied directly to one or both surfaces of an aligned integrated chip and circuit board substrate or the chip aligned on an integrated circuit board substrate can be capillary underfilled with the photopolymerizable adhesive composition, which is subsequently cured. Data storage disks can also be prepared by the method of the invention.

9 Claims, 2 Drawing Sheets

METHOD OF PRODUCING A LAMINATED STRUCTURE

This is a divisional of application Ser. No. 09/365,289, filed Jul. 30, 1999, now U.S. Pat. No. 6,395,124.

FIELD OF THE INVENTION

This invention relates to a method for laminating layers or articles, the method comprising curing a photopolymerizable composition through a colored, opaque, or reflective substrate. The article can be, for example, an electronic component, a printed circuit board, or the layers can be two opposing faces of a compact disc.

BACKGROUND OF THE INVENTION

Photopolymerization of monomers using UV light to prepare adhesive compositions is an established part of polymer chemistry. Numerous photopolymerizable compositions, for example, those comprising ethylenically-unsaturated monomers and at least one photoinitiator, have been photopolymerized using UV irradiation. A necessary condition for these photopolymerizations is that the photopolymerizable compositions must be directly exposed to the UV irradiation in order for the photoinitiating component to generate the free radicals required to initiate the photopolymerization process. Numerous industrial processes rely on selective UV photopolymerization, wherein a mask is used to block UV irradiation to specified areas of a surface or substrate so that photopolymerization takes place only in the exposed areas.

In the electronics industry, numerous methods have been used to bond electronic components together for purposes of forming multilayer components or simply adhering a component to a substrate. Methods involving photopolymerization have generally been limited to situations where at least one of the substrate or the component is essentially transparent to UV irradiation. However, in the case of bonding components to a printed circuit board (PCB), this seldom is possible, since PCBs are often made of opaque and colored materials and they usually are at least partially covered with metallic circuit traces. In addition, the electronic component itself, e.g., a chip, typically is completely non-transmissive to electromagnetic radiation. In general, the electronics industry has turned to thermally polymerizable adhesives when reinforcement of solder bonds is desired. This is not entirely satisfactory because of the lengthy thermal curing cycles required. In addition, some electronics components may be heat sensitive and free-radical thermal polymerizations in general do not lend themselves to patterned or selective activation.

Photopolymerization has been used in the bonding of electronic components. For example, surfaces to be joined have been coated with a photopolymerizable adhesive, followed by irradiating the adhesive, then placing the two parts together and allowing the irradiated adhesive to completely cure. Alternatively, irradiation at the peripheral edges of parts to be joined can result in a bond of sufficient strength to temporarily hold a component in place. Often, heating the joined components is necessary for complete curing.

Curing of photopolymerizable adhesives by UV irradiation through a substrate is known. For example, DE 3939628 discloses bonding of electronic components to aluminum oxide or aluminum nitride ceramic substrates that are up to 1500 $\mu$m thick by UV irradiation of at least 50 mW/cm output density. Transmission of UV light through an aluminum oxide ceramic substrate of 1016 $\mu$m thickness is reported to be about 0.6%.

U.S. Pat. No. 4,656,314 discloses curing of a conductive metal-coated UV-curable ink on a translucent PCB by UV irradiation from both the top and bottom of the PCB, wherein at least some of the UV light passes through the substrate from the underside to assist in the complete curing of the ink. The substrate is characterized as a sheet of polyester or polycarbonate that must be at least partially translucent, preferably more than 50% translucent to UV light. Conventional print treated MYLAR (Dupont) is described as an effective commercially available substrate.

U.S. Pat. No. 5,065,505 discloses a method of connecting circuit boards wherein a photocurable adhesive is coated onto a light-transmissive circuit board on which electrodes have been formed. Light is irradiated through the circuit board from the side opposite the coated side, curing the adhesive in areas not shaded by the electrodes. Exemplified photoinitiators have absorption peak wavelengths ranging from 240 nm to 365 nm. Photoinitiators useful in the visible light range are not described. Suitable circuit board substrates include polyimide resin, polyester resin, and the like.

Japanese Kokai Application JP 7-106723 discloses curing of adhesives through a flexible circuit board that is transmissive to 5% or more UV light having a wavelength between 350 and 400 nm. Base films, through which UV-curing takes place, can include poly(etherimide), poly (ethersulfone), polyethylene naphthalate, polyether ether ketone, polycarbonate, and polyethylene terephthalate.

Japanese Examined Application JP 7-81114 discloses curing a photohardenable adhesive in the presence of a diketone photoinitiator and a dialkylamino benzophenone photosensitizer by irradiation through a semitransparent substrate using irradiation wavelengths up to 436 nm.

U.S. Pat. No. 5,607,985 discloses a photopolymerization initiator for visible-light polymerizing adhesives comprising a photopolymerization initiator, an aliphatic tertiary amine and a radical polymerizing monomer. Adhesion of a sandwich construction comprising two opaque glass pieces, each having 10% light transmissivity at 510 nm and 0% light transmissivity between 490 and 200 nm, on exposure for two minutes to a metal halide lamp, is described.

U.S. Pat. No. 5,798,015 discloses generating reactive species (adhesives) by providing a wavelength-specific sensitizer in association with a reactive species-generating photoinitiator and irradiating the wavelength-specific sensitizer. The method is used to laminate at least two layers together by coating the adhesive between the layers and irradiating to effect polymerization thereof, providing that at least one of the layers is a cellulosic or polyolefin nonwoven web or film and the sensitizer is one of a set of specified arylketoalkene moieties.

Optical recording discs, such as compact discs and CD-ROMs, often comprise two or more layers of a polymeric base substrate, each of which comprises a recording layer, bonded together by an adhesive with both recording layers facing each other. Typically, the recording layers comprise an opaque metal foil. Uniform curing of the adhesive between the foils is difficult. U.S. Pat. No. 5,360,652 discloses such an optical recording disc, wherein the adhesive is a photocurable adhesive. In order to adhere the two discs together, the recording medium is configured not to extend to the periphery of the discs so that UV irradiation rapidly cures the adhesive around the edges of the disc, allowing the masked adhesive under the recording medium to cure only by contact with initiators in the irradiated region.

U.S. Pat. No. 5,785,793 discloses one- or two-sided irradiation of an optical recording disc having one or two back-to-back storage medium layers. Curable adhesive is used on the side opposite from the recording medium, in either case, so that UV irradiation must pass through at least the recording medium in order to cure the adhesive. Heat management is an issue for optical recording disc manufacture, since the discs are easily warped and the recording medium is typically a low-melting metal, such as aluminum. Xenon flash lamps are preferred for irradiating the curable adhesive and bonding the discs together.

Bonding of DVD (Digital Versatile Disk) substrates is described by D. Skinner, "UV Curing Through Semi-transparent Materials—The Challenge of the DVD Bonding Process," *RadCure Letter*, April, 1998, p. 53–56, wherein UV light of 320–390 nm wavelengths is shown to penetrate a 40 nm thick coating of aluminum on a polycarbonate substrate with 91% transmissivity. Curing of an adhesive under these conditions is not disclosed.

SUMMARY OF THE INVENTION

Briefly, the present invention provides a method of laminating a structure comprising the steps of:
  a) providing a structure comprising at least two layers and a photopolymerizable adhesive composition between the layers,
    1) at least one of the layers being opaque or colored and transmissive to actinic radiation in an identified spectral region having one or more wavelengths greater than 400 nm and up to 1200 nm, the layer being essentially free of cellulosic and olefinic functionality,
    2) the photopolymerizable composition comprising a photopolymerizable moiety and a photoinitiator therefor that absorbs actinic radiation in the identified spectral region of the radiation transmissive layer, the photopolymerizable moiety being polymerizable in a hydrosilation, cationic, or free radical polymerization process, with the proviso that the free radical polymerization process is free of dialkyaminobenzophenone sensitizer,
  b) directing actinic radiation within the identified spectral region through the radiation transmissive layer and into the photopolymerizable composition for less than two minutes to cure the photopolymerizable composition,
  whereby the resulting polymerized composition adheres to the layers and provides a laminated structure.

Optionally, the structure, including the photopolymerized composition, can be heated to complete the polymerization of the photopolymerizable composition.

Each of the layers of the invention independently can be a coating, a film, or a substrate, or it can be included in an article. Preferably the article can be an electrical component such as an integrated circuit chip (IC) or a printed circuit board (PCB).

In another aspect, there is provided a method for identifying suitable materials for two layers, a photopolymerizable adhesive composition, and a radiation source to be used for producing a laminated structure, the method comprising the steps of:
  a) identifying two layers, at least one of which is colored, opaque, or reflective and is transmissive to actinic radiation in an identified spectral region having one or more wavelengths greater than 400 nm and up to 1200 nm, with the proviso that when the radiation transmission layer is colored or opaque, it is essentially free of cellulosic and olefinic functionality,
  b) identifying a photopolymerizable composition to be disposed between the layers comprising a photopolymerizable moiety and a photoinitiator therefor that absorbs radiation in the identified spectral region of the radiation transmissive layer,
  c) identifying a radiation source that provides actinic radiation in the identified spectral region of the radiation transmissive layer and in the light absorbing wavelengths of the photoinitiator,
  whereby directing the actinic radiation, on demand, through the colored, opaque, or reflective layer, for a time sufficient to effect polymerization of the photopolymerizable composition, produces a laminated structure.

In a further aspect, the present invention provides a method for preparing a soldered and underfilled flip chip assembly on a circuit substrate, the method comprising the steps of:
  a) providing
    1) an integrated circuit chip having a surface comprising reflowable solder bumps with contact tips thereon, and
    2) a printed circuit substrate having a bonding site, wherein at least one of the chip and the circuit substrate is transmissive to actinic radiation in an identified spectral region having wavelengths greater than 400 nm and up to 1200 nm,
  b) applying a photopolymerizable adhesive composition directly to one or both of the surface of the chip with solder bumps and the bonding site of the printed circuit substrate, the method providing exposure of the contact tips of the solder bumps of the chip, the photopolymerizable adhesive composition comprising a photopolymerizable moiety and a photoinitiator therefor, wherein the photopolymerizable composition absorbs radiation in the identified spectral region of the radiation transmissive chip or circuit substrate,
  c) aligning and pressing the exposed tips of the bumps on the surface of the chip against the bonding site of the circuit substrate,
  d) melting and reflowing the solder to establish electrical contact between the chip and the circuit substrate, wherein the photopolymerizable material remains substantially uncured, and
  e) directing radiation within the identified spectral region through the radiation transmissive chip or circuit substrate for a time sufficient to cure the photopolymerizable adhesive composition and to produce the soldered and underfilled flip chip assembly on the circuit substrate.

Optionally, a functional evaluation of the soldered electrical connections may be performed prior to irradiation as described in step e). If the evaluation shows insufficient electrical contact between the chip and the substrate, the assembly can be reheated to allow easy removal of the chip from the substrate, after which the chip and the bonding site can be cleaned, soldering can be repeated, and a functional evaluation repeated to assure adequate electrical connection prior to irradiation.

In a still further aspect, the present invention provides a method of laminating a structure comprising the steps of
  a) providing a structure comprising at least two layers and a photopolymerizable adhesive composition between the layers,
    1) at least one of the layers being one or both of a reflective layer and a layer incorporated in an electronic component that is transmissive to actinic radiation in an identified spectral region having one or more wavelengths greater than 400 nm and up to 1200 nm, 2) the photopolymerizable composition comprising a photopolymerizable moiety and a photoinitiator therefor that absorbs actinic radiation in the identified spectral region of the radiation transmissive layer, the photopolymerizable moiety being polymerizable in a hydrosilation, cationic, or free radical polymerization process, b) directing actinic radiation within the identified spectral region through the radiation transmissive layer and into the photopolymerizable composition for less than 2 minutes to cure the photopolymerizable composition, whereby the resulting polymerized composition adheres to the layers and provides a laminated structure. In a preferred embodiment, this method provides a data storage disk.

In a yet further aspect, the present invention provides a method for preparing a soldered and underfilled flip chip assembly on a circuit substrate, the method comprising the steps of:

a) capillary underfilling a soldered chip on an integrated circuit substrate with a photopolymerizable adhesive composition comprising a photopolymerizble moiety and a photoinitiator therefor, wherein the circuit board is transmissive to actinic radiation in an identified spectral region having wavelengths greater than 400 nm and up to 1200 nm, and wherein the photopolymerizable composition absorbs radiation in the identified spectral region of the radiation transmissive circuit substrate, and b) irradiating the circuit substrate from the side opposite the side bearing the soldered chip with actinic radiation in said identified spectral region.

In this application:

"actinic radiation" means photochemically active radiation and particle beams, including, but not limited to, accelerated particles, for example, electron beams; and electromagnetic radiation, for example, microwaves, infrared radiation, visible light, ultraviolet light, X-rays, and gamma-rays;

"cure" and "polymerize" are used interchangeably in this application to indicate a chemical reaction in which relatively simple molecules combine to form a chain or net-like macromolecule;

"colored" means having visually perceptible color either to the naked or unaided eye, or to the aided eye, e.g., the light visually perceived by the eye after shining a light on a substrate;

"DVD" means both Digital Video Disc and Digital Versatile Disc;

"UV" or "ultraviolet" means actinic radiation having a spectral output between about 200 and about 400 nanometers;

"visible light" means actinic radiation having a spectral output greater than about 400 to about 700 nanometers;

"near IR" or "near infrared" means actinic radiation having a spectral output between about 700 and about 1200 nanometers;

"transparent" means that the material, when viewed under an optical microscope, (e.g., with a stereoscopic microscope at 50× and under oblique or transmitted light), has the property of transmitting rays of visible light so that images of articles viewed through the material have sharp edges;

"translucent" means that the material, in whole or in part (asd when patterned), when viewed as described under an optical microscope, has the property of transmitting visible light to some degree so that images have unclear or blurred edges;

"opaque" means that the material, when viewed as described under an optical microscope, has the property of being impervious to radiation at a given wavelength, in a multilayered material, one or more layers have continuous or discontinuous opaque regions; curing takes place through the opaque regions;

"light transmissive" means a substrate or article having an optical density of 4.0 or less, preferably an optical density between 4.0 and 2.0, and more preferably having an optical density between 4.0 and 3.0 when irradiated with a light of wavelength greater than 400 to 1200 nanometers;

"reflective" means capable of bending or returning or throwing back at least 90% of the incident light from a surface irradiated by that light;

"group" or "compound" or "ligand" means a chemical species that allows for substitution or which may be substituted by conventional substituents which do not interfere with the desired product, e.g., substituents can be alkyl, alkoxy, aryl, phenyl, halo (F, Cl, Br, I), cyano, nitro, etc.;

"photopolymerizable moiety" means a photopolymerizable monomer, oligomer, or polymer; and "reflow" means melting of a solder.

The present invention is advantageous in that it provides a unique method for laminating layers or articles using a photopolymerizable adhesive composition. The adhesive can be cured on demand indirectly through a variety of colored, opaque, or reflective substrates using actinic radiation in the range of greater than 400 to 1200 nm.

The curing can take place at elevated or ambient (20–25° C.) temperatures, which can be advantageous for temperature sensitive substrates.

Conventional methods of adhering face-down integrated circuits (e.g., flip-chips), or other articles, to ceramic, polyimide or epoxy-filled printed circuit boards (PCB's), or other substrates, typically use thermally cured epoxy-based adhesives which can be applied with capillary action after a solder connection has already been established, when reinforcement is necessary. This becomes increasingly difficult as, for example, chip size increases and as the number of electrical connections per chip increases. Also, there is a need in the art for pre-applied low temperature, e.g., less than 50° C., cure-on-demand adhesives and that do not use UV activated systems. UV activated systems can be impractical due to their inability to transmit UV light either edgewise or through an epoxy PCB or other substrate. Prior art UV methods traditionally required colorless transparent substrates. The present invention method, comprising photocuring using visible or near-infrared light, is advantageous in that colored and opaque substrates can be used. It is advantageous, also, that UV absorbing or reflecting substrates that are transmissive to actinic radiation within the desired spectral range can be used in the present invention method. Further, it is desirable to prepare wafers or circuits having pre-applied, self-fluxing, curable adhesives applied to the underside (e.g., bumped side) of the chip or circuit. Also, rapid cure of the adhesive is desired in order to minimize production time.

The present invention overcomes deficiencies of conventional curing systems by providing a method to rapidly photopolymerize a variety of radiation curable compositions (both thermoplastic films and flowable resins) directly through various PCB's or other substrates, both in unmetallized and metallized regions of the PCB's or other substrates, using visible light and/or near infrared curing systems. The ability to cure through the back side of a circuit substrate depends on several factors including line width and spacing, angle of irradiation, substrate and circuit thickness, and the type of metallized tracing. The low temperature method of the present invention can be useful with temperature sensitive substrates. Any composition that can be polymerized or crosslinked via direct photolysis or indirect photochemical generation of a thermal catalyst or initiator can be used in this approach. Shelf-stable, premixed compositions can be cured on demand using the method of the present invention.

The present invention is also advantageous in that it allows the use of a variety of light sources for initiating photopolymerization reactions, including many conventional, non-specialized light sources, such as halogen bulbs or other sources of visible light and/or near infrared radiation. The method of the invention is thus inherently safer to a human user than methods using, e.g., ultraviolet light, since less visible light and/or near infrared radiation is required to produce an equivalent amount of light density. The use of visible light and/or near infrared radiation sources is also advantageous over ultraviolet light sources because of the known degradative effects of UV light on substrates such as polymers. Finally, the invention allows facile visible-light curing of photopolymerizable compositions comprising helpful ultraviolet absorbing additives such as UV stabilizers and antioxidants.

U.S. application Ser. No. 08/986,661, filed Dec. 8, 1997, which is incorporated herein by reference for its disclosure of flip-chip assemblies and processes including all Figs. of the Drawing, relates to a method and assembly for connecting an integrated circuit chip to a circuit substrate.

DETAILED DESCRIPTION OF PREFERRED EMBODIMENTS

Figure 1A:
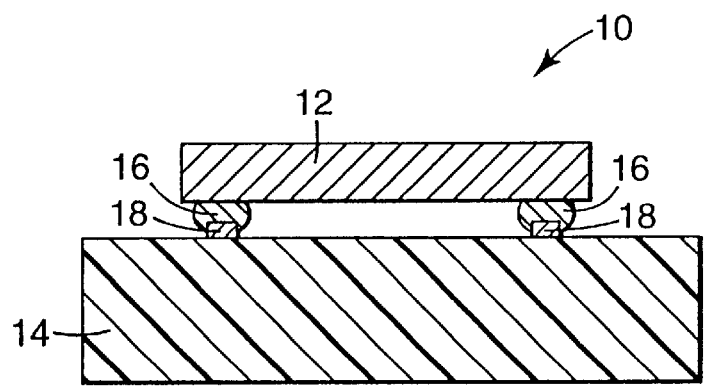
FIG. 1A shows a flip chip assembly, unfilled.

The present invention method provides a means to bond, quickly and conveniently, many different articles to a variety of substrates using actinic radiation in the visible or near infrared range. In some situations it may be desirable for both substrates to be transmissive to visible or near infrared radiation, but this is not required.

In a preferred embodiment, the present invention provides a process and assembly to configure a wafer-applied, self-fluxing, underfill photopolymerizable adhesive resin which can remain essentially uncured throughout the entire solder reflow process. After reflow and optional subsequent evaluation of electrical function, application of heat in conjunction with an appropriate visible-wavelength light applied through the backside of the printed circuit board can be used to provide a very rapid cure on demand. This can provide an adhesive resin that acts as a 'no-clean' flux, i.e., washing or cleaning of the PCB is not required after flux. In a single set of process steps, literally hundreds of chips can be adhered at one time.

The purpose of the flux is to remove metal oxides from the surfaces of the solder and the traces on the circuit board in order to permit complete wetting of the solder to the traces during reflow. This fluxing action takes place immediately prior to melting of the solder. In a typical conveyor-based solder reflow oven, the total soldering operation usually takes place over a period of about three to six minutes. The actual reflow of the solder normally occurs during the last minute or so of the process at which time the temperature of the components can reach 220° C. (for eutectic Sn/Pb solder). During most of the time in the oven, however, the temperature of the components is maintained at about 140 to 160° C. and it is at this time that the fluxing action takes place.

An ideal scenario can be as follows: An underfill photopolymerizable adhesive resin with fluxing activity is pre-applied to a chip at the wafer level. The chip is aligned and tack-bonded face-down on a circuit board assembly, and the board is placed in a conveyor-based reflow oven. While in the oven the circuit board assembly can be heated to a temperature of about 160° C. during which time the adhesive melts. The board assembly can then be held at about 160° C. for a period of 3 minutes during which time the adhesive acts as a flux and removes metal oxides from the solder and circuit trace surfaces. At this point the adhesive remains completely uncured and possesses low viscosity. Next the board assembly is heated to a temperature of 220° C. for a period of up to one minute, during which time the solder melts and wets out onto the cleaned surface of the circuit trace. At this point, if a heat curable adhesive is present, it will begin to polymerize. It is important, however, that the viscosity of the adhesive remains low at least until the solder wetting is completed. In fact, it is actually desirable that the adhesive resin remain ungelled after the reflow process. Use of a photopolymerizable adhesive resin in the present invention achieves these goals. This way, the soldered assembly can be evaluated electrically and if found to be non-functional it can be easily de-bonded, re-worked, and re-bonded. The need for re-workability is very important in many flip chip assemblies because often the circuit board assemblies are complex and expensive.

It is known in the art that the most effective fluxes are acidic. For example, most resin fluxes have pH values between 3 and 5. In particular, the active components in most commercial fluxes contain carboxylic acid functionality. This poses a potential problem because underfill adhesive materials are almost always epoxy-based. This means that an acidic material possessing fluxing activity which is added to an underfill adhesive composition will tend to act as a curing agent for a heat curable adhesive resin, thereby making it difficult to maintain low viscosity until after solder reflow.

In the present invention, however, the wafer-applied, self-fluxing underfill adhesive resin, being photopolymerizable, can remain partially or totally uncured throughout the entire solder reflow process described above Details of processes and materials for achieving flip chip assemblies are disclosed in U.S. application Ser. No. 08/986,661, filed Dec. 8, 1997, incorporated herein by reference. A typical assembly process for flip-chip assembly involves the following steps: 1) flux paste is applied to the substrate bond pads; 2) the IC is aligned and placed on the substrate while tackiness in the flux holds the chip in place; 3) the assembly is passed through the reflow oven and the solder melts and bonds metallurgically with the substrate pads; and 4) the sample is passed through a flux cleaning operation.

The finished flip chip assembly must then maintain electrical continuity throughout the lifetime of the device as measured by accelerated tests such as thermal cycling and thermal shock. Mismatches of both the coefficient of thermal expansion (CTE) and the elastic modulus (E) between the silicon IC and the PCB generate high stresses in the contact joints when the circuit is passed through thermal excursions. These stresses can lead to solder joint fatigue failure after repeated temperature cycles, and this is a primary failure mechanism for flip chip joints. This mechanism has limited the selection of substrate materials mainly to ceramic hybrid substrates such as $Al_2O_3$, which has high modulus and low CTE, properties similar to silicon. Even with ceramic substrates, flip chip assembly is limited to applications with small die.

During the last ten to fifteen years there has been increasing interest in learning how to apply this flip chip assembly to both larger size die and also to a broader range of printed circuit substrates. Specifically, the increased wiring densities available with today's organic based substrates makes them suitable low cost substitutes for ceramic substrates. However, the relatively high CTE of organic materials has slowed the implementation of flip chip assembly on organic substrates due to the aforementioned failure mechanism. An important breakthrough has been the development of underfill process. Underfill process uses a high modulus curable adhesive to fill the empty space between the solder balls under the chip so that the stress in the joint is shared by the adhesive and distributed more evenly across the entire interface as opposed to being concentrated at the perimeter balls. The use of an underfill adhesive as described above has enabled a flip-chip technology to be applied to a broader range of assemblies.

The present invention provides an advance in the art in that the underfill adhesive resin is photopolymerizable and allows for reworkability of the assembly after evaluation of electrical function subsequent to solder reflow and prior to cure of the adhesive.

Figure 1B:
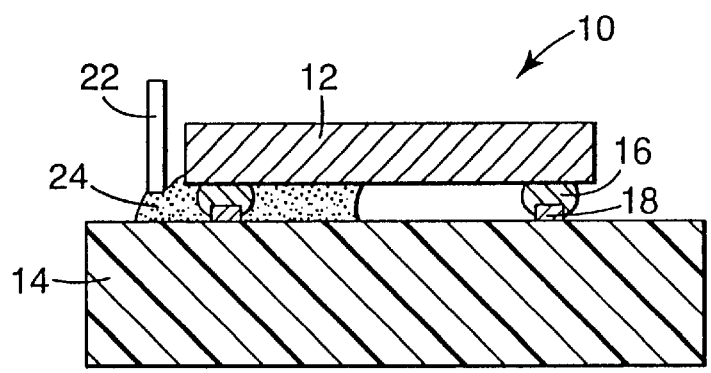
FIG. 1B shows a flip chip assembly, partially underfilled with photopolymerizable adhesive.
Figure 1C:
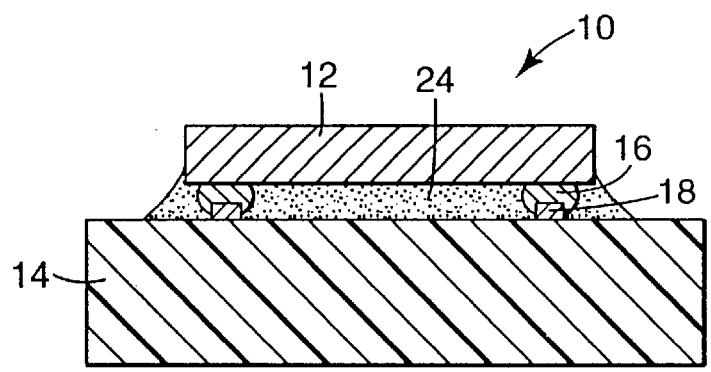
FIG. 1C shows a flip chip assembly, completely underfilled with photopolymerizable adhesive.
Figure 1D:
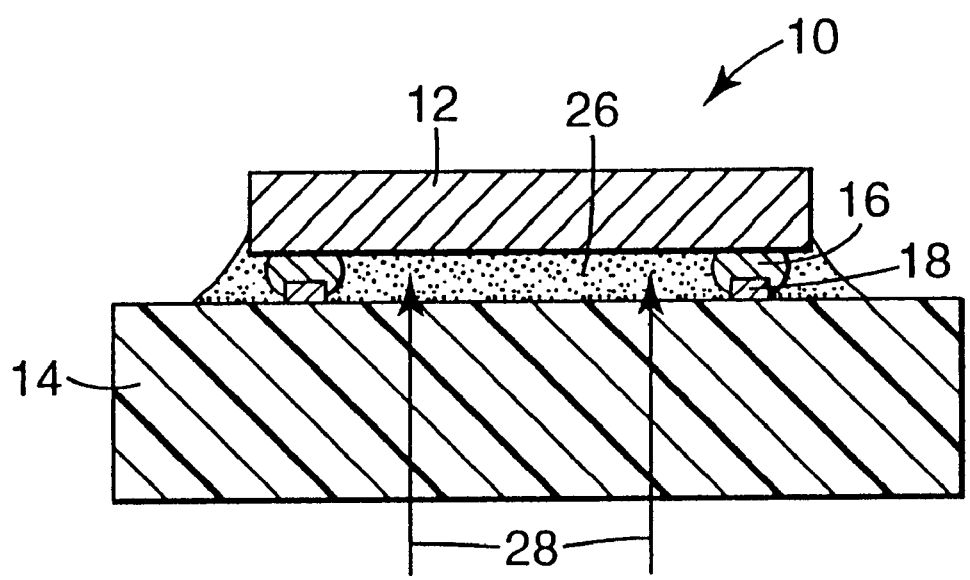
FIG. 1D shows a completely underfilled flip chip assembly exposed to visible light to achieve curing of the photopolymerizable adhesive.

FIGS. 1A, 1B, and 1C, and 1D show flip chip assembly 10 of the invention having an integrated chip (IC) 12 and a printed circuit board (PCB) 14 wherein the IC 12 and PCB 14 are aligned at solder bumps 16 and bond pads 18. In FIG. 1A, IC 12 and PCB 14 are held in alignment by a flux paste, not shown. In FIG. 1B, flip chip assembly 10 is shown partially underfilled at the interface between IC 12 and PCB 14 with photopolymerizable adhesive 24 which has been wicked in position using applicator 22. In FIG. 1C, flip chip assembly 10 is shown completely underfilled at the interface between IC 12 and PCB 14 with photopolymerizable adhesive 24. In an alternative embodiment, photopolymerizable adhesive 24 is applied to one or both opposing surfaces of IC 12 and PCB 14 prior to alignment of IC 12 and PCB 14. The tips of bond pads 18 and solder bumps 16 are free of adhesive at the time of alignment of IC 12 and PCB 14 and cure of photopolymerizable adhesive 24. Adhesive can be removed from bond pads by, for example, ablating, abrading, etching, or dissolving. In FIG. 1D, flip chip assembly 10 is irradiated by visible or near infrared radiation 28 through PCB 14 so as to produce photopolymerized adhesive 26.

Alternatively, a photopolymerizable adhesive, such as a photopolymerizable epoxy resin composition, can be introduced under an already-soldered flip chip assembly by any useful method, such as wicking or capillary filling, then photopolymerized in place by the method of the invention.

Other layers and articles that can be laminated using the method of the present invention include, for example, electronic components to substrates such as printed circuit boards or flexible printed circuits. Also useful are bonding steps such as board-to-board lamination, lamination of metal circuits or traces, assembly of connectors such as fiber optic connectors, or assembly of articles composed of metallized substrates such as data storage disks including compact discs, RAM (random access memory) disks, CD-ROM discs, and DVD's. In addition to uses directed to electronic components, the method of the present invention can be used to laminate other substrates that may be opaque to light of wavelengths of 400 nm or less or to certain regions of visible and near-IR light. These substrates may include those useful in multilayer and tamper-evident documents such as passports, credit cards, smart cards, and the like. Substrates may also include multilayer or metallized reflective films, such as those useful in optical systems. In addition, the method of the invention can be used for lamination or curing of structural materials such as fiberglass-reinforced polymers that may be useful in the manufacture of sporting goods such as boats, aircraft, or other vehicles. The method of the invention can be used to attach, for example, automobile rearview mirror assemblies to UV-absorbing windshields by irradiation through the windshield.

Substrates that are useful in the present invention include various transparent, translucent, or opaque materials such as plastics, ceramics, glasses, films, and papers. Reflective substrates useful in the invention include metallized films, multilayer optical films such as those described in U.S. Pat. Nos. 5,759,467, 5,822,774, 5,540,878, 5,448,404, 5,380,479, 5,234,729, 5,217,794, 5, 202,074, and 5,122,905, incorporated herein by reference, and retroreflective films such as those described in U.S. Pat. No. 4,025,159, incorporated herein by reference. Colored and opaque substrates including alumina, polyimide, and printed circuit substrates such as, for example, FR4, FR0406, and BT epoxy, including those having a colored solder mask or a colored coating, can be used, provided they are sufficiently light transmissive to allow initiation of the photopolymerization reactions described herein. UV or light absorbing or reflecting substrates that are transmissive to actinic radiation of wavelengths greater than 400 to 1200 nm can make useful substrates for the present invention. There is no particular limit to the thickness of the substrates useful in the present invention so long as sufficient visible or near IR light can be transmitted therethrough to effect the polymerization reactions described herein.

The present invention provides curing on a variety of substrates previously not possible by conventional UV cure using visible-light and near IR-curable adhesive systems. These include adhesion of reflective films to colored plastic substrates, metal sputtered films to epoxy substrates, articles to temperature sensitive substrates, and, generally, adhesion of translucent, opaque or reflective substrates to each other in any combination thereof. In addition, irradiation as described herein can be accomplished through either or both sides of the substrates. Further, irradiation as described herein can be direct or it can be reflected from a mirrored surface.

The photocurable compositions of the present invention can be liquids, gels, or films. Photopolymerizable compositions useful in the invention may include free-radically polymerizable, cationically-polymerizable and hydrosilation-polymerizable moieties. Such compositions comprise a photopolymerizable moiety and a visible- and/or near infrared-light photoinitiator therefor.

In one embodiment, the present invention provides a photopolymerizable composition comprising at least one cationically-polymerizable material and a photoinitiation system active in the spectral region of greater than 400 to 1200 nm. Examples of organic materials polymerizable by cationic polymerization and suitable for the hardenable compositions according to the invention are of the following types, it being possible for these to be used by themselves or as mixtures of at least two components:

A. Ethylenically unsaturated compounds polymerizable by a cationic mechanism. These include:
1. Monoolefins and diolefins, for example isobutylene, butadiene, isoprene, styrene, α-methylstyrene, divinylbenzenes, N-vinylpyrrolidone, N-vinylcarbazole and acrolein.
2. Vinyl ethers, for example methyl vinyl ether, isobutyl vinyl ether, trimethylopropane trivinyl ether and ethylene glycol divinyl ether; and cyclic vinyl ethers, for example 3,4-dihydro-2-formyl-2H-pyran (acrolein dimer) and the 3,4-dihydro-2H-pyran-2-carboxylic acid ester of 2-hydroxymethyl-3,4-dihydro-2H-pyran.
3. Vinyl esters, for example vinyl acetate and vinyl stearate.

B. Heterocyclic compounds polymerizable by cationic polymerization, for example ethylene oxide, propylene oxide, epichlorohydrin, glycidyl ethers of monohydric alcohols or phenols, for example n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetanes such as 3,3-dimethyloxetane and 3,3-di(chloromethyl)oxetane; tetrahydrofuran; dioxolanes, trioxane and 1,3,6-trioxacyclooctane; spiroorthocarbonates; lactones such as β-propiolactone, γ-valerolactone and ε-caprolactone; thiiranes such as ethylene sulfide and propylene sulfide; azetidines such as N-acylazetidines, for example N-benzoylazetidine, as well as the adducts of azetidine with diisocyanates, for example toluene-2,4-diisocyanate and toluene-2,6-diisocyanate and 4,4'-diaminodiphenylmethane diisocyanate; epoxy resins; and linear and branched polymers with glycidyl groups in the side-chains, for example homopolymers and copolymers of polyacrylate and polymethacrylate glycidyl esters.

Of particular importance among these above-mentioned polymerizable compounds are the epoxy resins and especially the diepoxides and polyepoxides and epoxy resin prepolymers of the type used to prepare crosslinked epoxy resins.

Epoxy compounds that can be cured or polymerized by the processes of this invention are those known to undergo cationic polymerization and include 1,2-, 1,3-, and 1,4-cyclic ethers (also designated as 1,2-, 1,3-, and 1,4-epoxides). The "Encyclopedia of Polymer Science and Technology", 6, (1986), p. 322, provides a description of suitable epoxy resins. In particular, cyclic ethers that are useful include the cycloaliphatic epoxies such as cyclohexene oxide and the ERL™ series type of resins available from Union Carbide, New York, N.Y., such as vinylcyclohexene oxide, vinylcyclohexene dioxide (ERL™-4206), 3,4-epoxy-6-methylcyclohexylmethyl-3,4-epoxy-6-methyl-cyclollexene carboxylate (ERL™-4201), bis(2,3-epoxycyclopentyl) ether (ERL™-0400), 3,4-epoxycyclohexylmethyl-3,4-epoxycyclohexane carboxylate (ERL™-4221), bis-(3,4-epoxycyclohexyl) adipate (ERL™-4289), aliphatic epoxy modified from polypropylene glycol (ERL™-4050 and ERL™-4052), dipentene dioxide (ERL™-4269), and 2-(3,4-epoxycylclohexyl-5,5-spiro-3,4-epoxy) cyclohexene-meta-dioxane (ERL™-4234); also included are the glycidyl ether type epoxy resins such as propylene oxide, epichlorohydrin, styrene oxide, glycidol, the EPON™ series type of epoxy resins available from Shell Chemical Co., Houston, Tex., including the diglycidyl ether of bisphenol A and chain extended versions of this material such as EPON 828™, EPON 1001™, EPON 1004™, EPON 1007™, EPON 1009™ and EPON 2002™ or their equivalent from other manufacturers; dicyclopentadiene dioxide; epoxidized vegetable oils such as epoxidized linseed and soybean oils available as VIKOLOX™ and VIKOFLEX™ resins from Elf Atochem North America, Inc., Philadelphia, Pa.; epoxidized KRATON™ LIQUID Polymers, such as L-207 available from Shell Chemical Co., Houston, Tex.; epoxidized polybutadienes such as the POLY BD™ resins from Elf Atochem, Philadelphia, Pa.; 1,4-butanediol diglycidyl ether, polyglycidyl ether of phenolformaldehyde; epoxidized phenolic novolac resins such as DEN 431™ and DEN 438™ available from Dow Chemical Co., Midland Mich.; epoxidized cresol novolac resins such as ARALDITE™ ECN 1299 available from Ciba, Hawthorn, N.Y.; resorcinol diglycidyl ether; epoxidized polystyrene/polybutadiene blends such as the EPOFRIEND™ resins such as EPOFRIEND A1010™ available from Daicel USA Inc., Fort Lee, N.J.; the HELOXY™ series of alkyl glycidyl ethers from Shell Chemical Co., Houston, Tex., such as alkyl $C_8$–$C_{10}$ glycidyl ether (HELOXY Modifier 7™), alkyl $C_{12}$–$C_{14}$ glycidyl ether (HELOXY Modifier 8™), butyl glycidyl ether (HELOXY Modifier 61™), cresyl glycidyl ether (HELOXY Modifier 62™), p-tert-butylphenyl glycidyl ether (HELOXY Modifier 65™), polyfunctional glycidyl ethers such as diglycidyl ether of 1,4-butanediol (HELOXY Modifier 67™), diglycidyl ether of neopentyl glycol (HELOXY Modifier 68™), diglycidyl ether of cyclohexanedimethanol (HELOXY Modifier 107™), trimethylol ethane triglycidyl ether (HELOXY Modifier 44), trimethylol propane triglycidyl ether (HELOXY Modifier 48™), polyglycidyl ether of an aliphatic polyol (HELOXY Modifier 84™), polyglycol diepoxide (HELOXY Modifier 32™); and bisphenol F epoxides.

The preferred epoxy resins include the ERL type of resins especially 3,4-epoxycyclohexylmethyl-3,4-epoxycyclohexanecarboxylate, bis-(3,4-epoxycyclohexyl) adipate and 2-(3,4-epoxycylclohexyl-5,5-spiro-3,4-epoxy) cyclohexene-meta-dioxane and the bisphenol A EPON type resins including 2,2-bis-(p-(2,3-epoxypropoxy) phenylpropane) and chain extended versions of this material. It is also within the scope of this invention to use a blend of more than one epoxy resin.

It is also within the scope of this invention to use one or more epoxy resins blended together. The different kinds of resins can be present in any proportion.

Optionally, monohydroxy- and polyhydroxy-alcohols may be added to the curable compositions of the invention, as chain-extenders for the epoxy resin. The hydroxyl-containing material used in the present invention can be any organic material having hydroxyl functionality of at least 1, and preferably at least 2.

Preferably the hydroxyl-containing material contains two or more primary or secondary aliphatic hydroxyl groups (i.e., the hydroxyl group is bonded directly to a non-aromatic carbon atom). The hydroxyl groups can be terminally situated, or they can be pendent from a polymer or copolymer. The molecular weight of the hydroxyl-containing organic material can vary from very low (e.g., 32) to very high (e.g., one million or more). Suitable hydroxyl-containing materials can have low molecular weights, i.e., from about 32 to 200, intermediate molecular weight, i.e., from about 200 to 10,000, or high molecular weight, i.e., above about 10,000. As used herein, all molecular weights are weight average molecular weights.

The hydroxyl-containing material can optionally contain other functionalities that do not substantially interfere with cationic cure at room temperature. Thus, the hydroxyl-containing materials can be nonaromatic in nature or can contain aromatic functionality. The hydroxyl-containing material can optionally contain heteroatoms in the backbone of the molecule, such as nitrogen, oxygen, sulfur, and the like, provided that the ultimate hydroxyl-containing material does not substantially interfere with cationic cure at room temperature. The hydroxyl-containing material can, for example, be selected from naturally occurring or synthetically prepared cellulosic materials. Of course, the hydroxyl-containing material is also substantially free of groups which may be thermally or photolytically unstable; that is, the material will not decompose or liberate volatile components at temperatures below about 100° C. or in the presence of actinic light which may be encountered during the desired curing conditions for the photocopolymerizable composition.

Useful hydroxyl-containing materials are described, for example, in U.S. Pat. No. 5,856,373, which is incorporated herein by reference.

The amount of hydroxyl-containing organic material used in the compositions of the invention may vary over broad ranges, depending upon factors such as the compatibility of the hydroxyl-containing material with the epoxide, the equivalent weight and functionality of the hydroxyl-containing material, the physical properties desired in the final cured composition, the desired speed of photocure, and the like.

Blends of various hydroxyl-containing materials may be useful in adhesives of the invention. Examples of such blends include two or more molecular weight distributions of hydroxyl-containing compounds, such as low molecular weight (below 200), intermediate molecular weight (about 200 to 10,000) and higher molecular weight (above about 10,000). Alternatively or additionally, the hydroxyl-containing material can contain a blend of hydroxyl-containing materials having different chemical natures, such as aliphatic and aromatic, or functionalities, such as polar and non-polar. As an additional example, one may use mixtures of two or more poly-functional hydroxy materials or one or more mono-functional hydroxy materials with poly-functional hydroxy materials.

Any cationically-reactive vinyl ether may be used in the polymerizable compositions of the present invention. Examples of vinyl ethers that may be used include tri (ethyleneglycol) divinyl ether (RAPI-CURE™ DVE-3, available from International Specialty Products, Wayne, N.J.), di(ethyleneglycol) divinyl ether, di(ethyleneglycol) monovinyl ether, ethylene glycol monovinyl ether, triethyleneglycol methyl vinyl ether, tetraethyleneglycol divinyl ether, glycidyl vinyl ether, butanediol vinyl ether, butanediol divinyl ether, 1,4-cyclohexanedimethanol divinyl ether (RAPI-CURE CHVE, International Specialty Products), 1,4-cyclohexanedimethanol monovinyl ether, 4-(1-propenyloxymethyl)-1,3-dioxolan-2-one, 2-chloroethyl vinyl ether, 2-ethylhexyl vinyl ether, methyl vinyl ether, ethyl vinyl ether, n-propyl vinyl ether, isopropyl vinyl ether, n-, iso- and t-butyl vinyl ethers, octadecyl vinyl ether, cyclohexyl vinyl ether, 4-hydroxybutyl vinyl ether, t-amyl vinyl ether, dodecyl vinyl ether, hexanediol di- and mono-vinyl ethers, trimetylolpropane trivinyl ether (TMPTVE, available from BASF Corp., Mount Olive, N.J.), aminopropyl vinyl ether, poly(tetrahydrofuran) divinyl ether, PLURIOL™ E200 divinyl ether, ethylene glycol butyl vinyl ether, 2-diethylaminoethyl vinyl ether, dipropylene glycol divinyl ether, and the VECTOMER™ divinyl ether resins commercially available from Allied Signal Inc., Morristown, N.J., such as a vinyl ether terminated aromatic urethane oligomer (VECTOMER™ 2010 and VECTOMER™ 2015), a vinyl ether terminated aliphatic urethane oligomer (VECTOMER™ 2020), hydroxybutyl vinyl ether isophthalate (VECTOMER™ 4010), and cyclohexane dimethanol monovinyl ether glutarate (VECTOMER™ 4020), or their equivalent from other manufacturers. It is within the scope of this invention to use a blend of more than one vinyl ether resin.

It is also within the scope of this invention to use one or more epoxy resins blended with one or more vinyl ether resins. The different kinds of resins can be present in any proportion.

Bifunctional monomers may also be used and examples that are useful in this invention possess at least one cationically polymerizable functionality or a functionality that copolymerizes with cationically polymerizable monomers, e.g., functionalities that will allow an epoxy-alcohol copolymerization.

When two or more polymerizable compositions are present, they can be present in any proportion.

The broad class of cationic photoactive groups recognized in the catalyst and photoinitiator industries may be used in the practice of the present invention. Photoactive cationic nuclei, photoactive cationic moieties, and photoactive cationic organic compounds are art recognized classes of materials as exemplified by U.S. Pat. Nos. 4,250,311; 3,708, 296; 4,069,055; 4,216,288; 5,084,586; 5,124,417; 4,985, 340, 5,089,536, and 5,856,373, each of which is incorporated herein by reference.

The cationically-curable materials can be combined with a three component or ternary photoinitiator system. Three component initiator systems are described in U.S. Pat. No. 5,545,676, U.S. application Ser. Nos. 08/838,835, and 08/840,093, both of which are now allowed, each of which is incorporated herein by reference. The first component in the photoinitiator system can be an iodonium salt, i.e., a diaryliodonium salt. The iodonium salt desirably is soluble in the monomer and preferably is shelf-stable, meaning it does not spontaneously promote polymerization when dissolved therein in the presence of the sensitizer and donor. Accordingly, selection of a particular iodonium salt may depend to some extent upon the particular monomer, sensitizer and donor chosen. Suitable iodonium salts are described in U.S. Pat. Nos. 3,729,313, 3,741,769, 3,808,006, 4,250,053 and 4,394,403, the iodonium salt disclosures of which are incorporated herein by reference. The iodonium salt can be a simple salt, containing an anion such as $Cl^-$, $Br^-$, $I^-$ or $C_4H_5SO_3^-$; or a metal complex salt containing an antimonate, arsenate, phosphate or borate such as $SbF_5OH^-$ or $AsF_6^-$. Mixtures of iodonium salts can be used if desired.

Examples of useful aromatic iodonium complex salt photoinitiators include: diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl) iodonium hexafluorophosphate; di(4-chlorophenyl) iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl) iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate (DPISbF$_6$).

Of the aromatic iodonium complex salts which are suitable for use in the compositions of the invention diaryliodonium hexafluorophosphate and diaryliodonium hexafluoroantimonate are among the preferred salts. These salts are preferred because, in general, they promote faster reaction, and are more soluble in inert organic solvents than are other aromatic iodonium salts of complex ions.

The second component in the photoinitiator system is the sensitizer. The sensitizer desirably is soluble in the monomer, and is capable of light absorption somewhere within the range of wavelengths of greater than 400 to 1200 nanometers, and is chosen so as not to interfere with the cationic curing process.

Suitable sensitizers desirably include compounds in the following categories: ketones, coumarin dyes (e.g., ketocoumarins), xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes and pyridinium dyes. Ketones (e.g., monoketones or alpha-diketones), ketocoumarins, aminoarylketones and p-substituted aminostyryl ketone compounds are preferred sensitizers. For applications requiring high sensitivity (e.g., graphic arts), it is preferred to employ a sensitizer containing a julolidinyl moiety. For applications requiring deep cure (e.g., cure of highly-filled composites), it is preferred to employ sensitizers having an extinction coefficient below about 1000, more preferably below about 100, at the desired wavelength of irradiation for photopolymerization. Alternatively, dyes that exhibit reduction in light absorption at the excitation wavelength upon irradiation can be used.

By way of example, a preferred class of ketone sensitizers has the formula:

where X is CO or CR$^5$ R$^6$, where R$^5$ and R$^6$ can be the same or different, and can be hydrogen, alkyl, alkaryl or aralkyl, b is zero or one, and A and B can be the same or different and can be substituted (having one or more non-interfering substituents) or unsubstituted aryl, alkyl, alkaryl, or aralkyl groups, or together A and B can form a cyclic structure which can be a substituted or unsubstituted cycloaliphatic, aromatic, heteroaromatic or fused aromatic ring.

Suitable ketones of the above formula include monoketones (b=0) such as 2,2-, 4,4- or 2,4-dihydroxybenzophenone, di-2-pyridyl ketone, di-2-furanyl ketone, di-2-thiophenyl ketone, benzoin, fluorenone, chalcone, Michler's ketone, 2-fluoro-9-fluorenone, 2-chlorothioxanthone, acetophenone, benzophenone 1- or 2-acetonaphthone, 9-acetylanthracene, 2-, 3- or 9-acetylphenanthrene, 4-acetylbiphenyl, propiophenone, n-butyrophenone, valerophenone, 2-, 3- or 4-acetylpyridine, 3-acetylcoumarin and the like. Suitable diketones include aralkyldiketones such as anthraquinone, phenanthrenequinone, o-, m- and p-diacetylbenzene, 1,3-, 1,4-, 1,5-, 1,6-, 1,7- and 1,8-diacetylnaphthalene, 1,5-, 1,8- and 9,10-diacetylanthracene, and the like. Suitable alpha-diketones (b=1 and X=CO) include 2,3-butanedione, 2,3-pentanedione, 2,3-hexanedione, 3,4-hexanedione, 2,3-heptanedione, 3,4-heptanedione, 2,3-octanedione, 4,5-octanedione, benzil, 2,2'-3,3'- and 4,4'-dihydroxylbenzil, furil, di-3,3'-indolylethanedione, 2,3-bornanedione (camphorquinone), biacetyl, 1,2-cyclohexanedione, 1,2-naphthaquinone, acenaphthaquinone, and the like.

The third component of the initiator system is an electron donor. The electron donor compound(s) desirably meets the requirements set forth in U.S. application Ser. Nos. 08/838,835, and 08/840,093, both of which are now allowed, each of which is incorporated herein by reference, and are soluble in the polymerizable composition. The donor can also be selected in consideration of other factors, such as shelf stability and the nature of the polymerizable materials, iodonium salt and sensitizer chosen. A class of donor compounds that may be useful in the inventive systems may be selected from some of the donors described in U.S. Pat. No. 5,545,676. Possible donor compounds that meet the criteria set forth therein must then be tested using one or both of the methods set forth below to determine if they will be useful donors for the photopolymerizable compositions of the invention.

The donor is typically an alkyl aromatic polyether or an N-alkyl arylamino compound wherein the aryl group is substituted by one or more electron withdrawing groups. Examples of suitable electron withdrawing groups include carboxylic acid, carboxylic acid ester, ketone, aldehyde, sulfonic acid, sulfonate and nitrile groups.

A preferred group of N-alkyl arylamino donor compounds is described by the following structural formula:

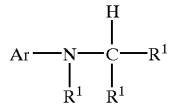

wherein each R$^1$ is independently H, C$_{1-18}$ alkyl that is optionally substituted by one or more halogen, —CN, —OH, —SH, C$_{1-18}$ alkoxy, C$_{1-18}$ alkylthio, C$_{3-18}$ cycloalkyl, aryl, COOH, COOC$_{1-18}$ alkyl, (C$_{1-18}$ alkyl)$_{0-1}$—CO—C$_{1-8}$ alkyl, SO$_3$R$^2$, CN or an aryl group that is optionally substituted by one or more electron withdrawing groups, or the R$^1$ groups may be joined to form a ring; and Ar is aryl that is substituted by one or more electron withdrawing groups. Suitable electron withdrawing groups include —COOH, —COOR$^2$, —SO$_3$R$^2$, —CN, —CO—C$_{1-18}$ alkyl and —C(O)H groups, wherein R$^2$ can be a C$_{1-18}$ straight-chain, branched, or cyclic alkyl group.

A preferred group of aryl alkyl polyethers has the following structural formula:

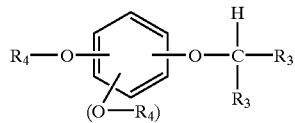

wherein n=1–3 each R$^3$ is independently H or C$_{1-18}$ alkyl that is optionally substituted by one or more halogen, —CN, —OH, —SH, C$_{1-18}$ alkoxy, C$_{1-18}$ alkylthio, C$_{3-18}$ cycloalkyl, aryl, substituted aryl, —COOH, —COOC$_{1-8}$ alkyl, —(C$_{1-18}$ alkyl)$_{0-1}$—COH, —(C$_{1-18}$ alkyl)$_{0-1}$—CO—C$_{1-18}$ alkyl, —CO—C$_{1-18}$ alkyl, —C(O)H or —C$_{2-18}$ alkenyl groups and each R$^4$ can be C$_{1-18}$ alkyl that is optionally substituted by one or more halogen, —CN, —OH, —SH, $C_{1-18}$ alkoxy, $C_{1-18}$ alkylthio, $C_{3-18}$ cycloalkyl, aryl, substituted aryl, —COOH, —COOC$_{1-18}$ alkyl, —($C_{1-18}$ alkyl)$_{0-1}$—COH, —($C_{1-18}$ alkyl)$_{0-1}$—CO—$C_{1-18}$ alkyl, —CO—$C_{1-18}$ alkyl, —C(O)H or —$C_{2-18}$ alkenyl groups.

In each of the above formulas the alkyl groups can be straight-chain or branched, and the cycloalkyl group preferably has 3 to 6 ring carbon atoms but may have additional alkyl substitution up to the specified number of carbon atoms. The aryl groups may be carbocyclic or heterocyclic aryl, but are preferably carbocyclic and more preferably phenyl rings.

Preferred donor compounds include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile and 1,2,4-trimethoxybenzene.

The photoinitiator compounds are provided in an amount effective to initiate or enhance the rate of cure of the resin system. It has been found that the amount of donor that is used can be critical particularly when the donor is an amine. Too much donor can be deleterious to cure properties. Preferably, the sensitizer is present in about 0.05–5 weight percent based on resin compounds of the overall composition. More preferably, the sensitizer is present at 0.10–1.0 weight percent. Similarly, the iodonium initiator is preferably present at 0.05–10.0 weight percent, more preferably at 0.10–5.0 weight percent, and most preferably 0.50–3.0 weight percent. Likewise, the donor is preferably present at 0.01–5.0 weight percent, more preferably 0.05–1.0 weight percent, and most preferably 0.05–0.50 weight percent.

Photopolymerizable compositions useful in the invention are prepared by simply admixing, under "safe light" conditions, the components as described above. Suitable inert solvents may be employed if desired when effecting this mixture. Any solvent may be used which does not react appreciably with the components of the inventive compositions. Examples of suitable solvents include acetone, dichloromethane, and acetonitrile. A liquid material to be polymerized may be used as a solvent for another liquid or solid material to be polymerized. Solventless compositions can be prepared by simply dissolving an aromatic iodonium complex salt and sensitizer in an epoxy resin-polyol mixture with or without the use of mild heating to facilitate dissolution.

An alternative photoinitiator system for cationic polymerizations includes the use of organometallic complex cations essentially free of metal hydride or metal alkyl functionality selected from those described in U.S. Pat. No. 4,985,340, and such description is incorporated herein by reference and has the formula:

$$[(L^1)(L^2)M]^{+q} \quad (1)$$

wherein

M represents a metal selected from the group consisting of Cr, Mo, W, Mn, Re, Fe, Ru, Os, Co, Rh, Ir, Pd, Pt and Ni, preferably Cr, Mo, W, Mn, Fe, Ru, Co, Pd, and Ni; and most preferably Mn and Fe;

$L^1$ represents 1 or 2 cyclic, polyunsaturated ligands that can be the same or different ligand selected from the group consisting of substituted and unsubstituted cyclopentadienyl, cyclohexadienyl, and cycloheptatrienyl, cycloheptatriene, cyclooctatetraene, heterocyclic compounds and aromatic compounds selected from substituted or unsubstituted arene compounds and compounds having 2 to 4 fused rings, and units of polymers, e.g., a phenyl group of polystyrene, poly(styrene-co-butadiene), poly(styrene-co-methyl methacrylate), poly(a-methylstyrene), and the like; a cyclopentadiene group of poly(vinylcyclopentadiene); a pyridine group of poly(vinylpyridine), and the like, each capable of contributing 3 to 8 electrons to the valence shell of M;

$L^2$ represents none, or 1 to 3 nonanionic ligands contributing an even number of electrons that can be the same or different ligand selected from the group of carbon monoxide, ketones, olefins, ethers, nitrosonium, phosphines, phosphites, and related derivatives of arsenic and antimony, organonitriles, amines, alkynes, isonitriles, dinitrogen, with the proviso that the total electronic charge contributed to M results in a net residual positive charge of q to the complex;

q is an integer having a value of 1 or 2, the residual charge of the complex cation.

Organometallic salts are known in the art and can be prepared as described in, for example, EPO No. 094,914 and U.S. Pat. Nos. 5,089,536, 4,868,288, and 5,073,476, and such descriptions are incorporated herein by reference.

Examples of preferred cations include:

diphenyliodonium, ditolyliodonium, didodecylphenyliodonium, (4-octyloxyphenyl) phenyliodonium, and bis(methoxyphenyl)iodonium;

triphenylsulfonium, diphenyl-4-thiophenoxyphenylsulfonium, and 1,4-phenylene-bis (diphenylsufonium);

bis($\eta^5$-cyclopentadienyl)iron(1+), bis($\eta^5$-methylcyclopentadienyl)iron (1+), ($\eta^5$-cyclopentadienyl)($\eta^5$-methylcyclopentadienyl)iron (1+), and bis($\eta^5$-trimethylsilylcyclopentadienyl)iron (1+);

bis($\eta^6$-xylenes)iron (2+), bis($\eta^6$-mesitylene)iron (2+), bis ($\eta^6$-durene)iron (2+), bis($\eta^6$-pentamethylbenzene)iron (2+), and bis($\eta^6$-dodecylbenzene) iron (2+);

($\eta^5$-cyclopentadienyl)($\eta^6$-xylenes)iron(1+) commonly abbreviated as (CpFeXy)(1+), ($\eta^5$-cyclopentadienyl)($\eta^6$-toluene)iron(1+), ($\eta^5$-cyclopentadienyl)($\eta^6$-mesitylene)iron(1+), ($\eta^5$-cyclopentadienyl)($\eta^6$-pyrene)iron(1+), ($\eta^5$-cyclopentadienyl)($\eta^6$-naphthalene)iron(1+), and ($\eta^5$-cyclopentadienyl)($\eta^6$-dodecylphenyl)iron(1+).

In another embodiment, the present invention provides a photopolymerizable composition comprising at least one free radically-polymerizable material and a photoinitiation system active in the spectral region of greater than 400 to 1200 nm.

Suitable free radically-polymerizable monomers may contain at least one ethylenically-unsaturated double bond, can be oligomers or polymers, and are capable of undergoing addition polymerization. Such monomers include mono-, di- or poly-acrylates and methacrylates such as methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyl-dimethylmethane, bis[1-(3-acryloxy-2-hydroxy)]-p- propoxyphenyldimethylmethane, tris(hydroxyethylisocyanurate) trimethacrylate; the bis-acrylates and bis-methacrylates of polyethylene glycols of molecular weight 200–500, copolymerizable mixtures of acrylated monomers such as those of U.S. Pat. No. 4,652,274, incorporated herein by reference, and acrylated oligomers such as those of U.S. Pat. No. 4,642,126, incorporated herein by reference; unsaturated amides such as methylene bis-acrylamide, methylene bis-methacrylamide, 1,6-hexamethylene bis-acrylamide, diethylene triamine tris-acrylamide and beta-methacrylaminoethyl methacrylate; and vinyl compounds such as styrene, diallyl phthalate, divinyl succinate, divinyl adipate and divinylphthalate. Mixtures of two or more monomers can be used if desired.

A variety of visible or near-IR photoinitiator systems may be used for photopolymerization of free-radically polymerizable materials useful in the invention. For example, the monomer can be combined with a three component or ternary photoinitiator system. The first component in the photoinitiator system is the iodonium salt, i.e., a diaryliodonium salt. The iodonium salt desirably is soluble in the monomer and preferably is shelf-stable (i.e., does not spontaneously promote polymerization) when dissolved therein in the presence of the sensitizer and donor. Accordingly, selection of a particular iodonium salt may depend to some extent upon the particular monomer, polymer or oligomer, sensitizer and donor chosen. Suitable iodonium salts are described in U.S. Pat. Nos. 3,729,313, 3,741,769, 3,808,006, 4,250,053 and 4,394,403, the iodonium salt disclosures of which are incorporated herein by reference. The iodonium salt can be a simple salt (e.g., containing an anion such as $Cl^-$, $Br^-$, $I^-$ or $C_4 H_5 SO_3^-$) or a metal complex salt (e.g., containing $SbF_5OH^-$ or $AsF_6^-$). Mixtures of iodonium salts can be used if desired.

Preferred iodonium salts include diphenyliodonium salts such as diphenyliodonium chloride, diphenyliodonium hexafluorophosphate and diphenyliodonium tetrafluoroborate.

The second component in the photoinitiator system is a sensitizer. These compounds have been disclosed above as sensitizers useful for cationically-curable materials. The sensitizer desirably is soluble in the monomer, and is capable of light absorption somewhere within the range of wavelengths of greater than 400 to 1200 nanometers, more preferably greater than 400 to 700 nanometers and most preferably greater than 400 to about 600 nanometers. The sensitizer may also be capable of sensitizing 2-methyl-4,6-bis(trichloromethyl)-s-triazine, using the test procedure described in U.S. Pat. No. 3,729,313, which is incorporated herein by reference. Preferably, in addition to passing this test, a sensitizer is also selected based in part upon shelf stability considerations. Accordingly, selection of a particular sensitizer may depend to some extent upon the particular monomer, oligomer or polymer, iodonium salt and donor chosen.

Preferred donors, the third component of the photoinitiator system, include amines (including aminoaldehydes and aminosilanes), amides (including phosphoramides), ethers (including thioethers), ureas (including thioureas), ferrocene, sulfinic acids and their salts, salts of ferrocyanide, ascorbic acid and its salts, dithiocarbamic acid and its salts, salts of xanthates, salts of ethylene diamine tetraacetic acid and salts of tetraphenylboronic acid. The donor can be unsubstituted or substituted with one or more non-interfering substituents. Particularly preferred donors contain an electron donor atom such as a nitrogen, oxygen, phosphorus, or sulfur atom, and an abstractable hydrogen atom bonded to a carbon or silicon atom alpha to the electron donor atom. A wide variety of donors is disclosed in U.S. Pat. No. 5,545,676, which is incoporated herein by reference.

Free-radical initiators useful in the invention, e.g., those that are photochemically active in the wavelength region of greater than 400 to 1200 nm, also may include the class of acylphosphine oxides, as described in European Patent Application No. 173567. Such acylphosphine oxides are of the general formula

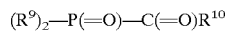

$(R^9)_2-P(=O)-C(=O)R^{10}$ wherein each $R^9$ individually can be a hydrocarbyl group such as alkyl, cycloalkyl, aryl, and aralkyl, any of which can be substituted with a halo-, alkyl- or alkoxy-group, or the two $R^9$ groups can be joined to form a ring along with the phosphorous atom, and wherein $R^{10}$ is a hydrocarbyl group, an S-, O-, or N-containing five- or six-membered heterocyclic group, or a $-Z-C(=O)-P(=O)-(R^9)_2$ group, wherein Z represents a divalent hydrocarbyl group such as alkylene or phenylene having from 2 to 6 carbon atoms.

Preferred acylphosphine oxides useful in the invention are those in which the $R^9$ and $R^{10}$ groups are phenyl or lower alkyl- or lower alkoxy-substituted phenyl. By "lower alkyl" and "lower alkoxy" is meant such groups having from 1 to 4 carbon atoms. Most preferably, the acylphosphine oxide is bis(2,4,6-trimethylbenzoyl)phenyl phosphine oxide (IRGACURE™ 819, Ciba Specialty Chemicals, Tarrytown, N.Y.).

Tertiary amine reducing agents may be used in combination with an acylphosphine oxide. Illustrative tertiary amines useful in the invention include ethyl 4-(N,N-dimethylamino) benzoate and N,N-dimethylaminoethyl methacrylate. The initiator can be employed in catalytically-effective amounts, such as from about 0.1 to about 5 weight percent, based on the weight of ethylenically-unsaturated compound present, of the acylphosphine oxide plus from about 0.1 to about 5 weight percent, based on the weight of ethylenically-unsaturated compound present, of the tertiary amine.

Commercially-available phosphine oxide photoinitiators capable of free-radical initiation when irradiated at wavelengths of greater than 400 nm to 1200 nm include a 25:75 mixture, by weight, of bis(2,6-dimethoxybenzoyl)-2,4,4-trimethylpentyl phosphine oxide and 2-hydroxy-2-methyl-1-phenylpropan-1-one (IRGACURE™ 1700, Ciba Specialty Chemicals), 2-benzyl-2-(N,N-dimethylamino)-1-(4-morpholinophenyl)-1-butanone (IRGACURE™ 369, Ciba Specialty Chemicals), bis($\eta^5$-2,4-cyclopentadien-1-yl)-bis (2,6-difluoro-3-(1H-pyrrol-1-yl)phenyl) titanium (IRGACURE™ 784 DC, Ciba Specialty Chemicals), a 1:1 mixture, by weight, of bis(2,4,6-trimethylbenzoyl)phenyl phosphine oxide and 2-hydroxy-2-methyl-1-phenylpropane-1-one (DAROCUR™ 4265, Ciba Specialty Chemicals), and ethyl-2,4,6-trimethylbenzylphenyl phosphinate (LUCIRIN™ LR8893X, BASF Corp., Charlotte, N.C.).

Free-radical initiators useful in the invention, e.g., those that are photochemically active in the wavelength region of greater than 400 to 1200 nm, also may include the class of ionic dye—counterion complex initiators comprising a borate anion and a complementary cationic dye. Borate anions useful in these photointiators generally can be of the formula

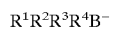

$R^1R^2R^3R^4B^-$ wherein $R^1$, $R^2$, $R^3$, and $R^4$ independently can be alkyl, aryl, alkaryl, allyl, aralkyl, alkenyl, alkynyl, alicyclic and saturated or unsaturated heterocyclic groups. Preferably, $R^2$, $R^3$, and $R^4$ are aryl groups and more preferably phenyl groups, and $R^1$ is an alkyl group and more preferably a secondary alkyl group.

Cationic counterions can be cationic dyes, quaternary ammonium groups, transition metal coordination complexes, and the like. Cationic dyes useful as counterions can be cationic methine, polymethine, triarylmethine, indoline, thiazine, xanthene, oxazine or acridine dyes. More specifically, the dyes may be cationic cyanine, carbocyanine, hemicyanine, rhodamine, and azomethine dyes. Specific examples of useful cationic dyes include Methylene Blue, Safranine O, and Malachite Green. Quaternary ammonium groups useful as counterions can be trimethylcetylammonium, cetylpyridinium, and tetramethylammonium. Other organophilic cations can include pyridinium, phosphonium, and sulfonium. Photosensitive transition metal coordination complexes that may be used include complexes of cobalt, ruthenium, osmium, zinc, iron, and iridium with ligands such as pyridine, 2,2'-bipyridine, 4,4'-dimethyl-2,2'-bipyridine, 1,10-phenanthroline, 3,4,7,8-tetramethylphenanthroline, 2,4,6-tri(2-pyridyl-s-triazine) and related ligands.

Borate salt photoinitiators are described, for example, in U.S. Pat. Nos. 4,772,530, 4,954,414, 4,874,450, 5,055,372, and 5,057,393, the disclosures of which are incorporated herein by reference.

In a further embodiment, a third kind of photopolymerization reaction useful in the invention includes the visible radiation-activated addition reaction of a compound containing silicon-bonded hydrogen with a compound containing aliphatic unsaturation. The addition reaction typically can be referred to as hydrosilation. Hydrosilation by means of visible light has been described, e.g., in U.S. Pat. Nos. 4,916,169 and 5,145,886, both of which are incorporated herein by reference Reactants useful in the radiation-activated hydrosilation reaction include compounds containing aliphatic unsaturation or acetylenic unsaturation. These compounds are well known in the art of hydrosilation and are disclosed in such Patents as U.S. Pat. No. 3,159,662, U.S. Pat. No. 3,220,972, and U.S. Pat. No. 3,410,886, incorporated herein by reference. In instances where these unsaturated compounds contain elements other than carbon and hydrogen, it is preferred that these elements be either oxygen, nitrogen, silicon, a halogen, or a combination thereof. The aliphatically unsaturated compound can contain one or more carbon-to-carbon multiple bonds. Representative examples of the aliphatically unsaturated hydrocarbons which can be employed include mono-olefins, for example, ethylene, propylene, and 2-pentene, diolefins, for example, divinylbenzene, butadiene, and 1,5-hexadiene, cycloolefins, for example, cyclohexene and cycloheptene, and monoalkynes, for example, acetylene, propyne, and 1-butene-3-yne. The aliphatically unsaturated compounds can have up to 20 to 30 carbon atoms, or more.

A particularly useful type of unsaturated compound, which can be employed in the practice of the present invention, is that containing silicon, such as those compounds commonly referred to as organosilicon monomers or polymers. These unsaturated organosilicon compounds have at least one aliphatically unsaturated organic group attached to silicon per molecule. Aliphatically unsaturated organosilicon compounds include silanes, polysilanes, siloxanes, silazanes, as well as monomeric or polymeric materials containing silicon atoms joined together by methylene or polymethylene groups or by phenylene groups.

The reactant containing the silicon-hydrogen linkage can be a polymeric compound or a compound that is not polymeric. These compounds are well known in the art and are also disclosed in the patents which describe the aliphatically unsaturated reactant, as cited above. The reactant containing the silicon-hydrogen linkage should contain at least one silicon-bonded hydrogen atom per molecule, with no more than three hydrogen atoms attached to any one silicon atom.

The hydrosilation composition useful in the synthesis of low molecular weight compounds by the process of the invention can be prepared by mixing about 0.1 to about 10.0 equivalent weights of the compound having silicon-bonded hydrogen with one equivalent weight of the compound having aliphatic unsaturation and then adding an amount of platinum complex catalyst sufficient to catalyze the reaction. The amount of the catalyst can range from about 5 to about 5000 parts by weight, preferably from about 25 to about 500 parts by weight, per 1,000,000 parts by weight of the total composition.

Known techniques can be used to conduct the hydrosilation reaction. In carrying out a hydrosilation reaction in the practice of this invention, the reactants and catalyst can be introduced into a vessel equipped for stirring, where the mixture is stirred and exposed to actinic radiation until the reaction is complete. If either of the reactants is a solid or is extremely viscous, a solvent can be introduced into the vessel to facilitate uniform mixing of the reactants. Suitable solvents include aromatic hydrocarbons, such as xylene and toluene, aliphatic hydrocarbons, such as hexane and mineral spirits, and halogenated hydrocarbons, such as chlorobenzene and trichloroethane. It is desirable that the solvent be transmissive to actinic radiation. From about 0.1 to about 10 parts of solvent per part by weight of the combined reactants can be used. The resulting reaction product will generally be sufficiently pure for its intended use. However, it may be desirable to remove the solvent if one has been employed.

The thoroughly mixed composition can then be applied to a substrate as a continuous or discontinuous layer by any suitable means, such as by-spraying, dipping, knife coating, curtain coating, roll coating, or the like, and the coating cured by using conventional techniques for providing actinic radiation. It is preferred that curing be conducted by exposing the coated substrate to radiation having a wavelength of greater than 400 nm to 1200 nm. Depending on the particular silicone formulation, catalyst, and intensity of the actinic radiation, curing can be accomplished in a period from less than one second to less than 2 minutes.

Catalysts useful in hydrosilation reactions include certain platinum complexes, such as platinum complex catalysts having one cyclopentadienyl group that is eta-bonded to the platinum atom and three aliphatic groups that are sigma-bonded to the platinum atom, in combination with visible and near-IR light sensitizes, as disclosed in U.S. Pat. No. 4,916,169, and Pt(II) β-diketonates, as disclosed in U.S. Pat. No. 5,145,886, the disclosures of each of which are incorporated herein by reference.

Representative examples of suitable ($\eta^5$-cyclopentadienyl)trialiphatic platinum complexes useful in the practice of this invention include the following, in which (Cp) represents the ($\eta^5$-cyclopentadienyl) group: (Cp)trimethylplatinum, (Cp)ethyldimethylplatinum, (Cp)triethylplatinum, (Cp)triallylplatinum, (Cp)tripentylplatinum, (Cp)trihexylplatinum, (methyl-Cp)trimethylplatinum, (trimethylsilyl-Cp)trimethylplatinum, (dimethylphenylsilyl-Cp)trimethylplatinum, and (Cp)acetyldimethylplatinum.

Other suitable ($\eta^5$-cyclopentadienyl)trialiphaticplatinum complexes suitable for this invention are described in U.S. Pat. No. 4,510,094, incorporated herein by reference.

Sensitizers suitable for this embodiment of the invention are those compounds capable of absorbing actinic radiation within the visible region of the electromagnetic spectrum, i.e., greater than 400 nm to about 800 nm, and capable of transferring energy to the platinum complex. In general, they must have a triplet energy level of at least 31 Kcal/mole, and must not inhibit the hydrosilation reaction. Sensitizers are preferably selected from two classes of compounds: (1) polycyclic aromatic compounds and (2) aromatic compounds containing a ketone chromophore. The sensitizer compounds can be substituted with any substituent that does not interfere with the light absorbing and energy transferring capabilities of the sensitizer compound or the hydrosilation catalyst. Examples of typical substituents include alkyl, alkoxy, aryl, aryloxy, aralkyl, alkaryl, halogen, etc. Representative examples of polycyclic aromatic sensitizers suitable for the invention include anthracene, 9-vinylanthracene, 9,10-dimethylanthracene, 9,10-dichloroanthracene, 9,10-dibromoanthracene, 9,10-diethylanthracene, 9,10-diethoxyanthracene, 2-ethyl-9,10-dimethylanthracene, naphthacene, pentacene, benz(a)anthracene, 7,12-dimethylbenz(a)anthracene, azulene and the like.

Representative examples of suitable Pt(II) beta-diketonate complexes include Pt(II) bis(2,4-pentanedionate), Pt(II) bis(2,4-hexanedionate), Pt(II) bis(2,4-heptanedionate), Pt(II) bis(3,5-heptanedionate), Pt(II) bis(1-phenyl-1,3-butanedionate), Pt(II) bis(1,3-diphenyl-1,3-propanedionate), and the like.

Compositions useful in the invention can contain a wide variety of adjuvants depending upon the desired end use. Suitable adjuvants include solvents, diluents, resins, binders, plasticizers, pigments, dyes, inorganic or organic reinforcing or extending fillers (at preferred amounts of about 10% to about 90% by weight, based on the total weight of the composition), thixotropic agents, indicators, inhibitors, stabilizers, UV absorbers, and the like. The amounts and types of such adjuvants, and their manner of addition to a composition of the invention will be familiar to those skilled in the art.

Actinic radiation of use in the present invention includes wavelengths within the range of greater than 400 to 1200 nm. Exemplary visible light sources include, but are not limited to, the sun, lasers, metal vapor (sodium and mercury) lamps, incandescent lamps, halogen lamps, mercury arc lamps, fluorescent room light, flashlights, light emitting diodes, tungsten halogen lamps, and xenon flash lamps.

Methods of the present invention quickly and conveniently bond materials on demand indirectly through a variety of substrates utilizing photopolymerizable compositions. The light curable compositions can be pre-applied as liquids or gels to the substrates. Alternatively, photo-crosslinkable thermoplastic films can be pre-applied to either a substrate or an article, and subsequently heated to provide a thermally repositionable adhesive that is permanently set upon light exposure through the substrate. This approach affords the ability to operate on both temperature sensitive and insensitive substrates. Also, the present invention provides the ability to photopolymerize materials through UV or visible light absorbing substrates via judicious selection of initiator systems and light sources so as to find correspondence of photoinitiator absorbance and radiation source emission with transmissive spectral regions of a substrate.

The key to successful photocuring of the photopolymerizable compositions through, for example, circuit boards, recording disks, multilayer reflective films, and retroreflective films, is threefold: 1) identification of light transmissive spectral regions associated with the various substrates; 2) identification of photoinitiators that absorb light at the transmission wavelengths of the substrates; and 3) selection of a light source that provides actinic radiation at wavelengths that are readily transmitted through the substrate and absorbed by the photoinitiator.

Optical Density and Light Transmission

Optical density pertains to the light absorptivity (Abs) and corresponding transmission (T) characteristics associated with a particular material at a given thickness.

This concept is typically described by Beer's Law:
Abs=ebc where
 e=molar absorptivity
 b=thickness or path length of light absorbing material
 c=concentration of light absorbing species
in addition, $$Abs = -\log T = \text{or } \log 1/T$$

One can readily quantify light absorption (by utilizing UV/VIS spectrometry) or transmission (by using an integrating sphere) and therefore interconvert Abs and % T and subsequently predict light absorbing characteristics for a type or thickness of material:

For example:

| Absorption (Optical density) | % T |
|---|---|
| 0.1 | 79.40 |
| 0.5 | 31.60 |
| 1.0 | 10.00 |
| 1.5 | 3.10 |
| 2.0 | 1.00 |
| 2.5 | 0.30 |
| 3.0 | 0.10 |
| 3.5 | 0.03 |
| 4.0 | 0.01 |
| 4.5 | 0.001 |

As the optical density or absorptivity increases the light transmission decreases. For example: the industry standard known as DVD 10, which is a two layer laminated polycarbonate disc coated with a metallic coating on both sides and an adhesive sandwiched in between, typically has an optical density between 2 and 3, equivalent to 0.1–0.3% light transmission through either side. The industry standard known as DVD 5 is also a laminated construction, however, only one side is coated with a metallized film whereas the other half of the sandwich construction is typically a clear or transparent polycarbonate that readily transmits longer wavelength UV and visible light. Materials with an optical density greater than 1.5 can be challenging materials to photocure through without appropriate light sources, initiators and overall understanding of the desired substrates. Particularly challenging are reflective materials with optical densities of greater than 2 such as DVD 10. Characterization of absorption or transmission of various substrates is essential to successful photocuring through the substrate.

Commonly used reflective materials in the prior art were perceived to be nontransmissive to visible radiation. It is now appreciated that only a perfect mirror reflects 100% of incident radiation. The present invention provides a unique opportunity for photocuring through such reflective substrates, which it is now appreciated can transmit light at certain wavelengths in the visible or near IR range.

Articles that can be bonded to substrates using the method of the present invention include, for example, electronic components to substrates such as printed circuit boards or flexible printed circuits. Also useful are bonding steps such as board-to-board lamination, lamination of metal circuits or traces, assembly of connectors such as fiber optic connectors, or assembly of articles composed of metallized substrates such as data storage disks including compact discs, RAM (random access memory) disks, CD-ROM discs, and DVD's. In addition to uses directed to electronic components, the method of the present invention can be used to laminate other substrates that may be opaque to light of wavelengths of 400 nm or less or to certain regions of visible and near-IR light. These substrates may include those useful in multilayer and tamper-evident documents such as passports, credit cards, smart cards, and the like. Substrates may also include multilayer or metallized reflective films, such as those useful in optical systems. In addition, the method of the invention can be used for lamination or curing of structural materials such as fiberglass-reinforced polymers that may be useful in the manufacture of sporting goods such as boats, aircraft, or other vehicles. The method of the invention can be used to attach, for example, automobile rearview mirror assemblies to UV-absorbing windshields by irradiation through the windshield.

Objects and advantages of this invention are further illustrated by the following examples. The particular materials and amounts thereof, as well as other conditions and details, recited in the examples should not be used to unduly limit this invention.

EXAMPLES

Unless otherwise specified, all materials were obtained, or are available, from Aldrich Chemical Co., Milwaukee, Wis.

Example 1

Two visible light polymerizable compositions were prepared as shown in Table 1, below:

TABLE 1

| | Adhesive Compositions | |
|---|---|---|
| Component | 1A (parts by weight) | 1B (parts by weight) |
| Bis(phenol A) diglycidyl dimethacrylate (Bis GMA) | 50.00 | 50.00 |
| Triethyleneglycol dimethacrylate (TEGDMA) | 50.00 | 50.00 |
| Camphorquinone (CPQ) | 00.17 | 00.10 |
| Ethyl p-dimethylaminobenzoate (EDMAB) | 01.00 | 01.00 |
| Diphenyl iodonium hexafluorophosphate (DPIPF$_6$) | 00.60 | 00.60 |
| Rose Bengal (RB) | 00.00 | 00.10 |

Composition 1A containing the sensitizer CPQ had a light absorbance between 400 and 500 nm whereas 1B containing both CPQ and RB absorbed between about 400 and 580 nm. One drop of 1A was applied to a region of an FR4 epoxy printed circuit board (PCB) (available from TRC Circuits, Minneapolis, Minn.) free of conductive metal contacts on either side. The board was approximately 1.5 mm thick. The light guide of 3M XL3000 dental curing light (with a light output between 400–500 nm, 3M, St. Paul, Minn.) w as placed in direct contact with the PCB on the side directly opposite the drop of adhesive. The light was activated for approximately 10 seconds, whereupon the liquid polymerized to a hard solid that was well adhered to the PCB. Composition 1B was evaluated in a similar manner and also was found to cure rapidly to a hard adhesive film. In addition, composition 1B, which was initially colored red, exhibited a visual change to near colorless upon light exposure and curing.

In a second trial, compositions 1A and 1B were applied to two distinct regions of the PCB, the regions bearing copper metal traces. One region had traces of approximately evenly spaced lines per cm, and the other had traces of approximately 1 mm in width spaced 1.5 mm apart. A bead of the adhesive to be examined was applied across the traces so as to cover both metallized and non-metallized surface. The various regions were irradiated from the reverse side of the PCB for about 20 seconds, as described for compositions 1A and 1B, above. Surprisingly, the liquid resins polymerized over all points of the PCB, including the metallized traces.

The above data show that a methacrylate functional composition readily photopolymerized through an FR4 epoxy printed circuit board at room temperature with visible light between 400–500 nm.

Example 2

A variety of UV and visible light photopolymerizable compositions were prepared as illustrated below.

Stock Solution 1

A stock solution (Stock Solution 1) was prepared by combining 100 grams each of Bis GMA and TEGDMA, followed by thorough mixing until homogeneous.

Ten photopolymerizable compositions were prepared by mixing 10.0 parts by weight of the stock solution with a photoinitiator or photoinitiator system, as shown in Table 2A, below. Each composition contained a different photoinitiator capable of initiating free radical polymerization at a particular range of wavelengths.

TABLE 2A

Adhesive Compositions

| Example | Photoinitiator | Amount Parts by weight | Wavelengths |
|---|---|---|---|
| 2A (comparative) | IRGACURE ™ 184[1] | 00.30 | (254–365 nm) |
| 2B (comparative) | IRGACURE ™ 500[2] | 00.30 | (254–360 nm) |
| 2C (comparative) | IRGACURE ™ 651[3] | 00.30 | (254–380 nm) |
| 2D (comparative) | IRGACURE ™ 907[4] | 00.30 | (254–375 nm) |
| 2E | IRGACURE ™ 369[5] | 00.30 | (254–425 nm) |
| 2F | IRGACURE ™ 1700[6] | 00.30 | (254–425 nm) |
| 2G | CPQ | 00.05 | (400–500 nm) |
| | EDMAB | 00.07 | |
| | DPIPF$_6$ | 00.06 | |
| 2H | Rose Bengal | 00.015 | (450–580 nm) |
| | EDMAB | 00.07 | |
| | DPIPF$_6$ | 00.06 | |
| 2I | Toluidine Blue O | 00.01 | (450–690 nm) |
| | EDMAB | 00.05 | |
| | DPIPF$_6$ | 00.05 | |
| 2J | Methylene Blue | 00.01 | (500–700 nm) |
| | EDMAB | 00.05 | |
| | DPIPF$_6$ | 00.50 | |

[1]IRGACURE ™ 184 is 1-hydroxycyclohexyl phenyl ketone (HCPK), commercially available from Ciba Specialty Chemicals Additives, Tarrytown, NY
[2]IRGACURE ™ 500 is a mixture of 1-hydroxycyclohexyl phenyl ketone and benzophenone, commercially available from Ciba Specialty Chemicals Additives
[3]IRGACURE ™ 651 is 2,2-dimethoxy-2-phenyl acetophenone (BDK), commercially available from Ciba Specialty Chemicals Additives
[4]IRGACURE ™ 907 is 2-methyl-1-(4-methylthio)phenyl)-2-morpholino propan-1-one (MMMP), commercially avaiable from Ciba Specialty Chemicals Additives
[5]IRGACURE ™ 369 is 2-benzyl-2-N,N-dimethylamino-1-(4-morpholinophenyl)-1-butanone (DBMP), commercially avaiable from Ciba Specialty Chemicals Additives
[6]IRGACURE ™ 1700 is a mixture comprising 25% bis(2,6-dimethoxybenzoyl)-2,4,4-trimethylpentyl phosphine oxide (DMBAPO) and 75% 2-hydroxy-2-methyl-1-phenyl-propan-1-one (HMPP), commercially available from Ciba Specialty Chemicals Additives The above photopolymerizable compositions were evaluated for photopolymerization gel times with three different light sources: 1)EFOS™ Ultracure 100 medium pressure mercury are lamp (254, 313, 365, 405, 430, 530, 545, 575, 590, 610 nm; EFOS, Inc., Mississauga, ON, Canada), 2) GE Light Engine™ (broad band visible 380–700 nm; GE Lighting Div. of GE Company, Cleveland, Ohio) and 3) 3M XL3000 dental curing light (400–500 nm).

One drop of each of the above resins was transferred to a sheet of polyester film and irradiated with each of the three light sources from a distance of about 10 mm until a polymerized solid was obtained, up to a maximum of 60 seconds. The results of this trial established the ability or inability of each composition to be photopolymerized with each light source in the absence of the various printed circuit board materials. The results can be found in Table 2C, below. Careful selection of both the light source and photointiator system was important for a successful polymerization to occur.

The above compositions were further examined for photopolymerization through several different printed circuit board materials including: 1) alumina (white), 2) FR4 epoxy (yellow), 3) FR4 epoxy+green solder mask (green), 4) FR0406 epoxy (yellow), 5) BT-epoxy (brown) and 6) polyimide (brown). PCB substrate 1 is commercially available from MMC Americas, Inc., Rolling Meadows, Ill. PCB substrates 2, 3, 4, and 5 are commercially available from TRC Circuits, Inc., Minneapolis, Minn. PCB substrate 6 is commercially available from 3M, St. Paul, Minn. The PCB's ranged in thickness from approximately 1 to about 2 mm. Each photopolymerizable composition was evaluated for photocuring with each curing light and each PCB material according to following procedure: One drop of the photopolymerizable composition was applied to a thin film of polyester which was placed directly on the PCB. The light guide of each respective light source was placed in direct contact with the PCB on the side directly opposite the drop of adhesive. The light was activated for approximately 20 seconds. Following the light exposure, the composition was examined and the physical state established as uncured (NC), slight gel (some solid formed in liquid), soft gel (soft solid formed), gelled (solid formed), or cured (hard solid formed). The results are compiled in Table 2C, below.

Total Light Transmission, Spectra of Various Printed Circuit Boards

Each printed circuit board material described above was evaluated for total light transmission from 200–2500 nm according to the following procedure: All measurements were made on a Perkin Elmer Lambda 19 Spectrophotometer fitted with an RSA-PE-19a integrating sphere accessory (Perkin Elmer Corp., Norwalk, Conn.). The sphere was 150 mm (6 inches) in diameter and complied with ASTM methods, e.g., D1003-97, and E308-96, as published in *ASTM Standards on Color and Appearance Measurement, Third Edition*, ASTM, West Conshohocken, Pa., 1991. The instrument was zeroed against air with a white plate in the rear sample position. A mask with a window of 0.32 cm×1.6 cm was placed directly in front of each circuit board sample. Set out below in Table 2B are the significant transmission wavelengths for each of the printed circuit board materials evaluated.

TABLE 2B

| Substrate Material | Observed Color | Useful Visible Light Transmission Wavelengths (nm) |
|---|---|---|
| 1) alumina | (white) | >400 nm |
| 2) FR4 epoxy | (yellow) | >400 nm |
| 3) FR4 epoxy + green solder mask | (green) | 475–575, >650 nm |
| 4) FR0406 epoxy | (yellow) | >475 nm |
| 5) BT-epoxy | (brown) | >525 nm |
| 6) polyimide | (brown) | >525 nm |

TABLE 2C

Irradiation Photopolymerizable Compositions Through Various Printed Circuit Board Materials with Three Light Sources

| Initiator System | | | Light Sources | | |
|---|---|---|---|---|---|
| Compounds | Absorption Wavelengths | Printed Circuit Board Material | EFOS ™ UV/VIS Med. Pressure Hg Arc 254, 313, 365, 405, 430, 530, 545, 575, 590, 610 nm | GE Light Engine ™ Visible 380–700 nm | 3M Dental Light Tungsten Halogen 400–500 nm |
| | | | Photopolymerization (20 seconds or less exposure) | | |
| IRGACURE ™ 184 (3%) (comparative) | 254–365 nm | None | <2 sec | NC[e] | NC |
| | | alumina | Cured[a] | NC | NC |
| | | FR4 epoxy (no mask) | NC | NC | NC |
| | | FR4 epoxy (green mask) | NC | NC | NC |
| | | FR0406 epoxy | NC | NC | NC |
| | | BT-epoxy | NC | NC | NC |
| | | polyimide | NC | NC | NC |

TABLE 2C-continued

Irradiation Photopolymerizable Compositions Through Various Printed Circuit Board Materials with Three Light Sources

| Initiator System | | | Light Sources | | |
|---|---|---|---|---|---|
| Compounds | Absorption Wavelengths | Printed Circuit Board Material | EFOS ™ UV/VIS Med. Pressure Hg Arc 254, 313, 365, 405, 430, 530, 545, 575, 590, 610 nm | GE Light Engine ™ Visible 380–700 nm | 3M Dental Light Tungsten Halogen 400–500 nm |
| IRGACURE ™ 500 (3%) (comparative) | 254–360 nm | None | <2 sec | 5 sec soft gel[c] | NC |
| | | alumina | soft gel | slight gel[d] | NC |
| | | FR4 epoxy (no mask | NC | NC | NC |
| | | FR4 epoxy (green mask) | NC | NC | NC |
| | | FR0406 epoxy | NC | NC | NC |
| | | BT-epoxy | NC | NC | NC |
| | | polyimide | NC | NC | NC |
| IRGACURE ™ 651 (3%) (comparative) | 254–380 nm | None | <2 sec | 5 sec gel[b] | NC |
| | | alumina | cured | NC | NC |
| | | FR4 epoxy (no mask | NC | NC | NC |
| | | FR4 epoxy (green mask) | NC | NC | NC |
| | | FR0406 epoxy | NC | NC | NC |
| | | BT-epoxy | NC | NC | NC |
| | | polyimide | NC | NC | NC |
| IRGACURE ™ 907 (3%) (comparative) | 254–375 nm | None | <2 sec | 10 sec | 20 sec soft gel |
| | | alumina | cured | soft gel | NC |
| | | FR4 epoxy (no mask) | NC | NC | NC |
| | | FR4 epoxy (green mask) | NC | NC | NC |
| | | FR0406 epoxy | NC | NC | NC |
| | | BT-epoxy | NC | NC | NC |
| | | polyimide | NC | NC | NC |
| IRGACURE ™ 369 (3%) | 254–425 nm | None | <2 sec | <2 sec | <2 sec |
| | | alumina | cured | cured | cured |
| | | FR4 epoxy (no mask) | cured | cured | cured |
| | | FR4 epoxy green mask) | NC | soft gel | cured |
| | | FR0406 epoxy | NC | NC | NC |
| | | BT-epoxy | NC | NC | NC |
| | | polyimide | NC | NC | NC |
| IRGACURE ™ 1700(3%) | 254–425 nm | None | <2 sec | <2 sec | <2 sec |
| | | alumina | cured | cured | cured |
| | | FR4 epoxy (no mask) | cured | cured | cured |
| | | FR4 epoxy (green mask) | NC | cured | cured |
| | | FR0406 epoxy | NC | NC | NC |
| | | BT-epoxy | NC | NC | NC |
| | | polyimide | NC | NC | NC |
| Camphorquinone (0.50%) | 400–500 nm | None | <2 sec | <2 sec | <2 sec |
| Ethyl dimethylamino-benzoate (0.70%) | | alumina | cured | cured | cured |
| Diphenyl Iodonium PF$_6$ (0.60%) | | FR4 epoxy (no mask) | cured | cured | cured |
| | | FR4 epoxy (green mask) | cured | cured | cured |
| | | FR0406 epoxy | soft gel | cured | cured |
| | | BT-epoxy | NC | NC | soft gel |
| | | polyimide | NC | NC | NC |

TABLE 2C-continued

Irradiation Photopolymerizable Compositions Through Various Printed Circuit Board Materials with Three Light Sources

| Initiator System | | | Light Sources | | |
|---|---|---|---|---|---|
| Compounds | Absorption Wavelengths | Printed Circuit Board Material | EFOS ™ UV/VIS Med. Pressure Hg Arc 254, 313, 365, 405, 430, 530, 545, 575, 590, 610 nm | GE Light Engine ™ Visible 380–700 nm | 3M Dental Light Tungsten Halogen 400–500 nm |
| Rose Bengal (0.15%) | 450–580 nm | None | <2 sec | <2 sec | <2 sec |
| Ethyl dimethylamino-benzoate (0.70%) | | alumina | cured | cured | cured |
| Diphenyl Iodonium PF$_6$ (0.60%) | | FR4 epoxy (no mask) | cured | cured | cured |
| | | FR4 epoxy (green mask) | cured | cured | cured |
| | | FR0406 epoxy | cured | cured | cured |
| | | BT-epoxy | soft gel | cured | cured (bottom only) |
| | | polyimide | soft gel | cured | NC |
| Toluidine Blue O (0.10%) | 450–690 nm | None | cured | cured | gelled |
| Ethyl dimethylamino-benzoate (0.50%) | | alumina | gelled | cured | NC |
| Diphenyl Iodonium PF$_6$ (0.50%) | | FR4 epoxy (no mask) | gelled | cured | NC |
| | | FR4 epoxy (green mask) | gelled | cured | NC |
| | | BT-epoxy | gelled | cured | NC |
| | | polyimide | gelled | cured | NC |
| Methylene Blue (0.10%) | 500–700 nm | None | cured | cured | NC |
| Ethyl dimethylamino-benzoate (0.50%) | | alumina | gelled | gelled | NC |
| Diphenyl Iodonium PF$_6$ (0.50%) | | FR4 epoxy (no mask) | NC | gelled | NC |
| | | FR4 epoxy (green mask) | gelled | cured | NC |
| | | BT-epoxy | NC | gelled | NC |
| | | polyimide | gelled | cured | NC |

(a)cured = hard solid formed
(b)gelled = solid formed
(c)soft gel = soft solid formed
(d)slight gel = some solid formed in liquid
(e)NC = not cured The data of Table 2C illustrate that successful photocuring of compositions through the printed circuit boards required three key elements including: 1) identification of light transmissive spectral regions associated with the various substrates; 2) identification of photoinitiators that absorbed light at the transmission wavelengths of the substrate; and 3) selection of a light source that provided actinic radiation at wavelengths that were readily transmitted through the substrate and were absorbed by the photoinitiator. Successful photopolymerization through most PCB's required wavelengths of light beyond the UV portion of the electromagnetic spectrum, i.e., greater than 400 nm.

Example 3

Several adhesive liquids and films were prepared as described below:
Adhesive films:
Sample 3-A A 7 g sample of acrylated epoxy CN™ 104 (Sartomer Co., Inc., Exton, Pa.) was combined with 10.5 g of a solution (28.6%w/w in tetrahydrofuran (THF)) of powdered phenoxy resin PKHP (Phenoxy Associates, Rock Hill, S.C.). A clear solution was obtained. To this solution, camphorquinone (0.05 g), Ph$_2$ISbF$_6$ (0.05 g) and EDMAB (0.05 g) were added. The solution was coated at 0.15 mm (6 mil) on a silicone treated poly(ethylene terephthalate) (PET) release liner, such as is commercially available from Courtalds Aerospace, Inc.; Glendale, Calif., then allowed to air dry. All coating and drying was performed under yellow lights.

Sample 3-B

A 7 g sample of tris(hydroxyethyl)isocyanurate triacrylate (SR368™, Sartomer Co., Inc.) was combined with 10 g of a solution (30%w/w in THF) of bisphenol Z-type polycarbonate (TS2020™, Teijin Chemicals, Ltd., Tokyo, JP). Bisphenol Z is 1,1-bis(4-hydroxyphenyl)cyclohexane. A clear solution was obtained. The same catalysts and amounts were added as described for Sample 3-A above. Coating was also as described above.

Liquid adhesives:

Sample 3-C

To 1.25 g of a solution (40% in THF) of polyetherimide oligomer (ULTEM™, GE Plastics Div., GE Company, Pittsfield, Mass.) was added 9.5 g of 3,4-epoxycyclohexylmethyl-3,4-epoxycyclohexanecarboxylate (ERL™ 4221, Union Carbide Corp., Danbury, Conn.). The sample was shaken until homogeneous. The resulting solution was charged with 0.10 g of organometallic photoinitiator (antimony pentafluoride salt of cyclopentadienyl iron xylenes, $CpFeXySbF_6$, 3M). The solution was poured into small aluminum pans to allow the solvent to evaporate. A clear liquid was obtained, and protected from light.

Additional liquid adhesive 3-D and 3-E, having formulations shown in Table 3A, were prepared by mixing the ingredients as shown.

TABLE 3A

Adhesive Compositions

| Component | 3-D (parts by weight) | 3-E (parts by weight) |
|---|---|---|
| Bis(glycidyl methacrylate) (Bis GMA) | 22.50 | 12.50 |
| Triethyleneglycol dimethacrylate (TEGDMA) | 02.50 | 12.50 |
| Camphorquinone (CPQ) | 00.12 | 00.17 |
| Ethyl p-dimethylaminobenzoate (EDMAB) | 00.12 | 01.00 |
| Diphenyl iodonium hexafluorophosphate | 00.12 | 00.60 |
| Rose Bengal (RB) | 00.012 | 00.10 |
| R976 fumed silica | 00.00 | 03.50 |

Curing of Adhesives:

Procedure 1

Adhesives 3-A, 3-B, and 3-C were used to mount silica chips to alumina and FR4 circuit boards having a solder mask. In the case of film adhesives, the adhesive was laminated onto the chip or the circuit board. For the liquid adhesive, a small drop was placed on the board and used to hold the chip in place. For curing the adhesives, all samples were placed on a hot plate with the temperature set to 180° C. with the chip in direct contact with the hot plate. Additional chips were used as spacers around the periphery of the board. The adhesive was irradiated through the circuit board for 20 sec with a 3M XL3000 dental curing light with a light output between 400 and 500 nm. All adhesives cured to hard materials and the chips could not be removed when pried with tweezers.

Procedure 2

Compositions 3-A, 3-D and 3-E were evaluated as possible adhesives for mounting silica chips to FR4 circuit boards according to the following procedure: A silica chip was placed in contact with a metal plate heated at 180° C. for approximately 30 seconds. The FR4 PCB was held by vacuum to a transparent quartz plate. The liquid resin or thermoplastic film was applied to the PCB, and the 1° C.B and chip brought together under 207 KPa (30 psi) pressure for about 10 seconds then irradiated through the quartz plate with a 3M XL3000 Dental curing light for 20 to 30 seconds. The vacuum was removed, releasing the PCB and silica chip. As a comparative, the trial was repeated without exposure to light. All samples were evaluated with tweezers and determined to be either well-adhered ("good adhesion") or easily removed ("poor adhesion"). Results are shown in Table 3B, below:

TABLE 3B

| Sample | Light exposure | No light exposure |
|---|---|---|
| 3A | well-cured/good adhesion | no-cure/poor adhesion |
| 3D | well-cured/good adhesion | no-cure/poor adhesion |
| 3E | well-cured/good adhesion | no-cure/poor adhesion |

The data clearly show that chips can be effectively bonded to printed circuit boards via light exposure through the circuit board surface opposite to the chip/PCB interface. In the absence of light exposure the adhesive compositions remained uncured, therefore providing the possibility of soldering without premature polymerization. Both films and liquid compositions (including cationically and/or free radically curable systems) were effective.

Example 4

Photolaminating Compact Discs

Two metallized polycarbonate halves of a Compact Disc (CD), each with an optical density of about 2.5, were photolaminated to one another according to the following method:

A thin film of the adhesive according to the formulations shown below in Table 4 was applied to the metallic side of one disc, followed by placement of the metallic side of a second disc in contact with the coated adhesive. Slight pressure was applied to the sandwiched construction to provide a thin and relatively even adhesive layer. The samples were then placed on a standard radiation processing line at a distance slightly beyond the manufacturer's recommended exposure distance using a Fusion Q bulb (Fusion UV Systems, Inc., Gaithersburg, Md.) that provided an output of about 2.6 watts/cm$^2$ (between 400 and 500 nm) at a line speed of about 2.4 m/minute. This provided a residence time under the light of about 0.6 seconds and a dosage of 2.6 J/cm$^2$. The resulting samples were well adhered and attempts to separate them resulted in delamination of the metallic coating from the polycarbonate disc. The ability to rapidly photolaminate through reflective substrates using this approach was thus confirmed. The two adhesive formulations evaluated for DVD use are shown below. These materials absorbed visible light between 400–500 nm and were well matched with the Fusion Q bulb. This method provided a rapid and simple process for laminating a variety of reflective substrates including DVD-RAMs, DVDs, CD's, etc.

TABLE 4

| Component | Parts by weight |
|---|---|
| Adhesive 1 | |
| UV-6100B/HPA DVD Adhesive | 50.00 |
| Camphorquinone | 0.50 |
| Ethyl p-dimethylaminobenzoate | 0.35 |

TABLE 4-continued

| Component | Parts by weight |
|---|---|
| Adhesive 2 | |
| UV-6100B/HPA DVD Adhesive | 50.00 |
| Camphorquinone | 0.50 |
| Ethyl p-dimethylaminobenzoate | 0.25 |
| Diphenyl iodonium hexafluorophosphate | 0.50 |

UV6100B is a urethane diacrylate monomer available from Nippon Gosei Kagaku (Nippon Synthetic Chemical Industry, Inc., Osaka, JP).

HPA is hydroxypropyl acrylate monomer available from Rohm Tech Inc., Malden. Mass.

Example 5

Photolaminating Reflective Films Using a Cationically Curable Epoxy Composition

Two highly reflective metallized sputtered aluminum PET films, each with an optical density of about 2.5, were photolaminated to one another with a photocurable epoxy composition according to the following method:

A thin film of a liquid epoxy adhesive (formulation shown in Table 5, below) was applied to the metallic side of a 2.5 cm×2.5 cm sample of sputtered aluminum-coated PET film, followed by placement of the metallic side of a similar 2.5 cm×2.5 cm square of aluminized PET film in contact with the coated adhesive. Slight pressure was applied to the sandwiched construction to provide a thin and relatively even adhesive layer. The sample was directly contacted and irradiated for 60 seconds with the light guide (12 mm diameter) of a 3M XL-3000 dental curing light, which provided approximately 500 mw/cm$^2$ of blue light having a wavelength between 400 and 500 nm. The sample was examined 30 minutes later and was observed to be well cured and adhered only in the region placed directly beneath the light. The remainder of the epoxy composition was uncured. This example confirms that reflective substrates were rapidly photolaminated with a photocurable epoxy via light exposure through highly reflective aluminized PET films.

TABLE 5

| Adhesive Composition | |
|---|---|
| Component | Parts by weight |
| ERL 4221E Epoxy | 9.50 |
| p-THF 250 diol | 0.50 |
| Camphorquinone | 0.10 |
| Ethyl p-dimethylaminobenzoate | 0.01 |
| Dodecyl diaryl iodonium methide | 0.15 |

ERL 4221E is a cycloaliphatic diepoxide available from Union Carbide.

Dodecyl diaryl iodonium methide is bis(dodecylphenyl) iodonium tris(tifluoromethylsulfonyl)methide, prepared as described in Example 2 of U.S. Pat. No. 5,554,664, incorporated herein by reference.

Example 6

Photolaminating Reflective and Colored Multilayered Films

Two highly reflective (non-metallized) multi-layered films, each with an optical density of about 2.5, were photolaminated to one another with a visible light photocurable methacrylate composition according to the following method:

A thin film of a methacrylate adhesive (formulation below) was applied to one side of a 5 cm×5 cm multi-layered reflective film, described in Example 1 of U.S. patent application Ser. No. 09/126,917, which is incorporated herein by reference, followed by placement of a similar 5 cm×5 cm square multilayered reflective film in contact with the coated adhesive. Slight pressure was applied to the sandwiched construction to provide a thin and relatively even adhesive layer. The sample was directly contacted and irradiated for 10 seconds with the light guide (12 mm diameter) of a 3M XL-3000 dental curing light which provided approximately 500 mw/cm$^2$ of blue light having a wavelength between 400 and 500 nm. The sample was examined immediately and observed to be well cured and adhered in the region placed directly beneath the light. Most of the remaining methacrylate was uncured. This confirms that reflective multilayer films were rapidly photolaminated with a photocurable composition via light exposure through highly reflective multilayer films. This approach provides a rapid and simple process for laminating a variety of reflective and colored multilayered films.

TABLE 6

| Adhesive Formulation | |
|---|---|
| Component | Parts by weight |
| Bis GMA | 5.00 |
| TEGDMA | 5.00 |
| Camphorquinone | 0.02 |
| Ethyl p-dimethylaminobenzoate | 0.10 |
| Diphenyliodonium hexafluorophosphate | 0.06 |

Example 7

Underfilled Electronic Device (Acrylate Adhesive)

A black, opaque electronic chip was soldered in place on a 1.5 mm thick FR4 printed circuit board having metallic contacts thereon, and coated on both sides with a solder mask. A space of approximately 0.10 mm remained between the top of the PCB mask and the soldered chip. This assembly was placed on a hot plate at 100° C. for approximately one minute, then a drop of a red-colored acrylate adhesive formulation described above as Example 1B in Table 1 was placed on one side of the soldered chip, at the interface of the board and the chip. The adhesive formulation wicked under the chip in about 5 seconds. The assembly was removed from the hot plate and immediately subjected to irradiation by a XL-3000 blue dental light (3M) through the FR4 board from the side opposite the soldered chip. The adhesive was observed to solidify rapidly and change from red to colorless in less than 20 seconds.

Example 8

Underfilled Electronic Device (Acrylate Adhesive)

The procedure of Example 7 was repeated except that the circuit board with soldered chip was not heated prior to application of the adhesive. The adhesive formulation required approximately two minutes to wick under the chip at 23° C. When the adhesive had wicked under the chip, the assembly was heated on a hot plate at 100° C. for 20 seconds, whereupon the adhesive formed a bead around all sides of the chip. The assembly was removed from the hot plate and immediately exposed to light as described in Example 7 for 20 seconds, at which time the adhesive was cured.

Example 9

Underfilled Electronic Device (Epoxy Adhesive)

The procedure of Example 7 was repeated except that an epoxy adhesive formulation, shown in Table 5, above, was used in place of an acrylate adhesive. The epoxy adhesive wicked under the chip in about 5 seconds. The assembly was removed from the hot plate and immediately subjected to irradiation by a XL-3000 blue dental light (3M) through the FR4 board from the side opposite the soldered chip. The adhesive was observed to solidify rapidly and change from red to colorless in less than 20 seconds.

Example 10

Underfilled Electronic Device (Filled Acrylate Adhesive)

The procedure of Example 7 was repeated except that the acrylate adhesive was modified by addition of a filler prior to applying the adhesive to the chip-board interface. An amorphous spherical silica powder having an average particle size of approximately 5 microns (SILSTAR™ LE-05, Nippon Synthetic Chemical Industry Co., Ltd. Tokyo, JP) was added in the amount of 1.44 g filler per g of acrylate adhesive to achieve a loading of 65% by weight. The filled adhesive was dispensed along one side of the heated chip assembly. After two minutes on the hot plate, there was no evidence of any fillet formation on the side opposite from where the adhesive was dispensed. The adhesive was cured using the XL-3000 blue dental light, after which the chip was de-bonded from the board for examination. Approximately 90% of the area under the chip had been encapsulated, and the adhesive appeared to be fully cured.

Example 11

Underfilled Electronic Device (Filled Epoxy Adhesive)

The procedure of Example 10 was repeated except that the acrylate adhesive was replaced by the epoxy adhesive as described in Example 9. The amorphous silica filler was used at 65% by weight loading. After two minutes on the hot plate, there was no adhesive formulation seen on the side opposite from where the adhesive was dispensed. Subsequently, the dispensed adhesive was cured in the same manner as described in example 7, after which the chip was de-bonded from the board for examination. Approximately 90% of the area under the chip had been encapsulated, and the adhesive appeared to be fully cured.

Various modifications and alterations that do not depart from the scope and intent of this invention will become apparent to those skilled in the art. This invention is not to be unduly limited to the illustrative embodiments set forth herein.

What is claimed is:

1. A method for preparing a soldered and underfilled flip chip assembly on a circuit substrate, the method comprising the steps of:
   a) providing
      1) an integrated circuit chip having a surface comprising reflowable solder bumps with contact tips thereon, and
      2) a printed circuit substrate having a bonding site, wherein at least one of said chip and said circuit substrate is transmissive to actinic radiation in an identified spectral region having wavelengths greater than 400 nm and up to 1200 nm,
   b) applying a photopolymerizable adhesive composition directly to one or both of the surface of the chip with solder bumps and the bonding site of the printed circuit substrate, said method providing exposure of said contact tips of said solder bumps of said chip, said photopolymerizable adhesive composition comprising a photopolymerizable moiety and a photoinitiator therefor, wherein said photopolymerizable composition absorbs radiation in said identified spectral region of said radiation transmissive chip or circuit substrate,
   c) aligning and pressing the exposed tips of the bumps on the surface of said chip against the bonding site of said circuit substrate,
   d) subjecting the flip chip assembly to heat at a temperature sufficient to melt and reflow the solder so as to establish electrical contact and a metallurgical bond between said chip and said circuit substrate,
   wherein the photopolymerizable material remains substantially uncured, and
   e) directing radiation within said identified spectral region through said radiation transmissive chip or circuit substrate for a time sufficient to cure said photopolymerizable adhesive composition and to produce said soldered and underfilled flip chip assembly on said circuit substrate.

2. The method according to claim 1 further comprising conducting a functional evaluation of the soldered electrical connections prior to performing radiation step e).

3. The method according to claim 2 further comprising performing steps of
   i) removing the chip from the circuit substrate if the functional evaluation shows insufficient electrical contact therebetween, and
   ii) cleaning the chip and the bonding site of the circuit substrate and repeating steps a) through e).

4. The method according to claim 1 wherein one or both of said chip and said circuit substrate is opaque.

5. The method according to claim 4 wherein said cure of said photopolymerizable adhesive composition takes place in a time period in the range of more than zero seconds to less than 2 minutes.

6. The method according to claim 1 wherein one or both of said chip and said circuit substrate is colored.

7. The method according to claim 1 wherein one or both of said chip and circuit substrate is selected from the group consisting of alumina and polyimide substrates.

8. The method according to claim 1 wherein said circuit substrate is selected from the group consisting of FR4, FR0406, and BT epoxy substrates.

9. The method according to claim 1 wherein the temperature of the flip chip assembly in step d) is up to about 220 degrees C.

* * * * *

UNITED STATES PATENT AND TRADEMARK OFFICE
CERTIFICATE OF CORRECTION

PATENT NO. : 6,692,611 B2
DATED : February 17, 2004
INVENTOR(S) : Oxman, Joel D.

It is certified that error appears in the above-identified patent and that said Letters Patent is hereby corrected as shown below:

Column 1,
Line 64, delete "mW/cm", insert in place thereof -- $mW/cm^2$ --;

Column 11,
Line 57, delete "cyclollexene", insert in place thereof -- cyclohexene --;

Column 16,
Line 64, delete "$COOC_{1-8}$", insert in place thereof -- $COOC_{1-18}$ --;

Column 21,
Line 36, aftr "reference" insert -- . --;

Column 22,
Line 37, delete "by-spraying", insert in place thereof -- spraying --;

Column 23,
Line 42, delete "are", insert in place thereof -- arc --;

Column 25,
Lines 56-57, after "Minn.)" delete "w as", insert in place thereof -- was --;

Column 26,
Line 1, after "approximately', insert -- 25 --;
Line 67, delete "are", insert in place thereof -- arc --;

Column 28,
Line 4, after "Transmission", delete ",";

Column 29-30,
Line 17, under "Printed Circuit Board Material", after "mask" insert -- ) --;
Line 40, under "Printed Circuit Board Material", insert -- ( -- before "green";

UNITED STATES PATENT AND TRADEMARK OFFICE
CERTIFICATE OF CORRECTION

PATENT NO.    : 6,692,611 B2
DATED         : February 17, 2004
INVENTOR(S)   : Oxman, Joel D.

It is certified that error appears in the above-identified patent and that said Letters Patent is hereby corrected as shown below:

Column 33,
Line 65, delete "1°C.B", insert in place thereof -- PCB --.

Signed and Sealed this

Twenty-second Day of June, 2004

JON W. DUDAS
*Acting Director of the United States Patent and Trademark Office*